(12) United States Patent
Watanabe et al.

(10) Patent No.: US 6,955,994 B2
(45) Date of Patent: Oct. 18, 2005

(54) METHOD OF MANUFACTURING SEMICONDUCTOR DEVICE AND METHOD OF MANUFACTURING OPTICAL WAVE GUIDE

(75) Inventors: Takayuki Watanabe, Yamanashi (JP); Hiroaki Ito, Yamanashi (JP); Takuya Fujii, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 137 days.

(21) Appl. No.: 10/024,391

(22) Filed: Dec. 21, 2001

(65) Prior Publication Data

US 2002/0119661 A1 Aug. 29, 2002

(30) Foreign Application Priority Data

Dec. 25, 2000 (JP) ........................................ 2000-393318

(51) Int. Cl.⁷ ............................................ H01L 21/302
(52) U.S. Cl. ........................ 438/745; 438/747; 438/748; 438/750
(58) Field of Search ................................ 438/745, 747, 438/748, 750, 41

(56) References Cited

U.S. PATENT DOCUMENTS

| | | | |
|---|---|---|---|
| 5,227,015 A | | 7/1993 | Fujihara et al. ............. 156/647 |
| 5,441,912 A | * | 8/1995 | Tsukiji et al. ................. 438/40 |
| 5,452,315 A | * | 9/1995 | Kimura et al. ................ 372/46 |
| 6,037,189 A | * | 3/2000 | Goto ............................ 438/31 |
| 6,110,756 A | * | 8/2000 | Otsuka et al. ................ 438/41 |

FOREIGN PATENT DOCUMENTS

| | | |
|---|---|---|
| EP | 0 665 581 | 8/1995 |
| EP | 0 717 477 | 6/1996 |
| EP | 0 785 602 | 7/1997 |
| JP | 4-307984 | 10/1992 |
| JP | 09-283505 | 10/1997 |
| JP | 10-65201 | 3/1998 |
| JP | 2000-91303 | 3/2000 |

OTHER PUBLICATIONS

Sadao Adachi, "Chemical Etching of InGaAsP/InP DH Wafer", Journal of the Electrochemical Society, vol. 129, Mar. 1982, pp. 1053–1062.*

Adachi et al., "Chemical Etching of InGaAsP/InP DH Wafer", Journal of the Electrochemical Society, vol. 129, No. 3, Mar. 1982, pp. 1053–1062.

Copy of European Patent Office Communication including European Search Report for corresponding European Patent Office Application 01310826 dated Oct. 30, 2003.

* cited by examiner

Primary Examiner—Nadine G. Norton
Assistant Examiner—Binh X. Tran
(74) Attorney, Agent, or Firm—Armstrong, Kratz, Quintos, Hanson & Brooks, LLP

(57) ABSTRACT

A method of manufacturing a semiconductor device, including the steps of (a) rowing an InP layer on a surface of starting growth, resulting in the InP layer having a convex structure, and (b) wet etching the InP layer by an enchant including hydrochloric acid and acetic acid, and thereby flattening a surface of the InP layer.

40 Claims, 40 Drawing Sheets

METHOD OF MANUFACTURING SEMICONDUCTOR DEVICE AND METHOD OF MANUFACTURING OPTICAL WAVE GUIDE

BACKGROUND OF THE INVENTION

1. Field of the Invention

The present invention generally relates to compound semiconductor devices, and more particularly, to a method of manufacturing an optical semiconductor element used for an optical communication and an optical information management.

2. Description of the Related Art

A compound semiconductor has a band structure of a direct transition type and acts with light reciprocally. Therefore, an optical semiconductor device using a compound semiconductor is utilized variously in fields of an optical communication and an optical information management. A semiconductor device of a compound in an InP group, particularly a laser diode, is used for forming an optical signal transferred in an optical fiber with a wavelength in a range of 1.3 to 1.55 mm.

In order to improve a laser oscillation efficiency, it is essential to provide an electric current blocking structure for the laser diode. In the electric current blocking structure, a carrier is shut in a limited area in an axial direction. Besides, it is also essential to shut a light efficiently in the area where the carrier is shut, because the laser oscillation is generated in the laser diode due to a stimulated emission. Shutting the light to a horizontal direction in the laser diode in the InP group is realized on a basis of a difference of a refractive index between InGaAs core wave guiding a light and an InP buried layer.

FIG. 1A to 1D are views for explaining a manufacturing process of a laser diode 10 having a buried hetero structure (BH structure) as an electric current blocking structure and optical confinement structure.

Referring to FIG. 1A, a multi-quantum well layer 12 is formed on an n-type 10P substrate 11. An InGaAs layer and an InGaAs layer are grown repeatedly in the multi-quantum well layer 12. A p-type InP clad layer 13 is formed in the multi-quantum well layer 12, and a p-type InGaAs contact layer 14 layer is formed on the p-type InP clad layer 13.

In a process shown in FIG. 1B following the process shown in FIG. 1A, a $SiO_2$ film 15 is formed on the contact layer 14 as an etching protection layer. After forming of the $SiO_2$ film 15, an active layer mesa stripe is formed by dry etching. The mesa stripe is extended in the <011>-direction in FIG. 1B.

In a process shown in FIG. 1C following the process shown in FIG. 1B, the $SiO_2$ film 15 is used as a selective growth mask. Besides, a crystal growth of an InP buried layers 16A and 16B having high resistances is implemented at both sides of the mesa stripe by a metal organic vapor phase epitaxy (MOVPE) method. The InP buried layers 16A and 16B are formed by Fe doping. During a re-growth process of the InP buried layers 16A and 16B, a growth stop surface (111) B surface is generated, and thereby the InP buried layers 16A and 16B have growth configurations in which mask edges of the InP buried layers 16A and 16B are bulged in areas 16a and 16b.

In a process shown in FIG. 1D following a process shown in FIG. 1C, the $SiO_2$ film 15 is eliminated. Besides, a p-side electrode 17 is formed on the contact layer 14, and an n-side electrode 18 is formed on a bottom surface of the substrate 11.

Thus, in case of a buried growth of the InP buried layers 16A and 16B when the $SiO_2$ film 15 is used as a selective growth mask, it may be difficult to avoid the bulges of the InP buried layers 16A and 16B in the areas 16a and 16b corresponding to edges of the $SiO_2$ film 15. This is because a material concentration is increased partially on the $SiO_2$ film 15, because the crystal growth is not generated on a mask of the $SiO_2$ film 15. The material is excessively provided on surfaces of the InP buried layers 16A and 16B growing at both sides of the mesa stripe. For instance, during the process shown in FIG. 1C, when the mesa stripe has a height of approximately 1.5 mm, the InP buried layers 16A and 16B are bulged with a height of approximately 0.7 mm in areas 16a and 16b of the mask edges.

As described above, during the process shown in FIG. 1D, the p-side electrode 17 is formed on a surface having a step structure. If the p-side electrode 17 is formed by sputtering a Ti film, a Pt film and an Au film in turn, a disadvantage occurs. That is, because the Ti film and the Pt film have a thickness of approximately 0.1 mm each and the p-side electrode 17 is formed on the surface having the step structure, an electrode layer is broken at a concave-convex part 17a. If the electrode layer is broken, passing of an electric current through such electrode becomes uneven, and thereby an electric deterioration of a device is produced.

Meanwhile, an optical integrated circuit element has received attention recently as an important optical semiconductor device. The laser diode, awave guide, a light-receiving element, and an optical function element are integrated in the optical integrated circuit element. In such an optical integrated circuit element, the mesa stripe may be extended to a direction other than <011> or a branch point may exist in the mesa stripe. If a burying growth of the mesa stripe of the <011>-direction is implemented as shown in FIG. 1C, the growth stop surface (111) B surface is generated. However, regarding a burying growth of the optical integrated circuit element, an overhang part that a buried layer 23 is extended on a $SiO_2$ mask 22 may be generated as shown in FIGS. 3-(A) to 3-(C), because a particular growth stop surface does not exist in the optical integrated circuit clement. Here, FIG. 3-(A) is a perspective view of such the optical wave guide; FIG. 3-(B) is a cross-sectional view thereof; and FIG. 3-(C) is a partially enlarged view thereof.

Referring to FIGS. 3-(A) to 3-(C), a $SiO_2$ pattern 22 having an opening part is formed on an InP substrate 21. The InP substrate 21 is partially exposed by the opening part. An InP buried layer 23 is formed on an partially exposed surface of the InP substrate 21 by using the $SiO_2$ pattern 22 as a mask, through a re-growth process. At this time, because the InP buried layer 23 does not have a growth stop surface such as the growth stop surface (111) B surface, the InP buried layer 23 grows to a side beyond the opening part of the $SiO_2$ pattern 22. As a result of this, an overhang part 23A is formed on the $SiO_2$ pattern 22, as shown in FIG. 3-(C).

As shown in FIG. 4, if an InP layer 24 re-grows after the $SiO_2$ pattern 22 is removed, a material gas does not reach a part directly under the overhang part 23A, and thereby a cave part 23B may be formed thereon. Such a cave part 23B has a quite different refractive index from the InP buried layer 23. Therefore, a light which is wave guided in the wave guide is scattered, and thereby a loss of light is caused.

FIGS. 5A to 5B are views for explaining a problem of a laser diode in the case in which a mesa stripe 31M is extended to a direction other than the <101>-direction, and InP buried layers 32A and 32B are formed on both sides of the mesa stripe 31M by using a $SiO_2$ film 33 formed on the mesa stripe 31M as a selective growth mask.

In an example shown in FIG. 5A, the mesa stripe 31M is extended to an offset direction at an angle of 10° from <011>-direction to <010>-direction. As shown in an enlarged view in FIG. 5A, because the InP buried layers 32A and 32B do not have growth stop surfaces, the InP buried layers 32A and 32B grows onto the SiO$_2$ film 33. As a result of this, the overhang part is generated on the SiO$_2$ film 33.

If the SiO$_2$ mask 33 is removed by etching and an hip layer 34 is grown as covering the InP buried layers 32A and 32B and the mesa stripe 31M, a vapor material does not reach a directly under area of the overhang part, and thereby cave parts 32a and 32b may be formed thereon, as shown in an enlarged view in FIG. 5B.

SUMMARY OF THE INVENTION

Accordingly, it is a general object of the present invention is to provide a novel and useful method of manufacturing a semiconductor device.

Another and more specific object of the present invention is to provide a method of manufacturing a semiconductor device, in which an InP layer having a convex structure can be flattened after a growth of the InP layer.

Still another object of the present invention is to provide a method of manufacturing a semiconductor device, including the steps of (a) growing an InP layer on a surface of starting growth, resulting in the InP layer having a convex structure, and (b) wet etching the InP layer by an etchant including hydrochloric acid and acetic acid, and thereby flattening a surface of the InP layer.

A further object of the present invention is to provide a method of manufacturing a semiconductor device, including the steps of (a) etching an InP layer which shoulders a selective etching mask, has a lower surface area than the selective etching mask, and has a convex structure on a surface of the InP layer, by an etchant including hydrochloric acid and acetic acid, and (b) flattening a surface of the InP layer except an area under the selective etching mask.

A further object of the present invention is to provide a method of manufacturing a semiconductor device, including the steps of (a) forming a semiconductor structure in which first to fourth semiconductor layers are grown, wherein the first semiconductor layer made of n-type InP is grown on a n-type InP substrate, the second semiconductor layer having a smaller band gap than InP is grown on the first semiconductor layer, the third semiconductor layer made of p-type InP is grown on the second semiconductor layer, and the fourth semiconductor layer made of InGaAs or InGaAsP is grown on the third semiconductor layer, (b) etching the semiconductor structure in which the semiconductor layers are grown, and thereby a mesa stripe is formed on a part including at least the second to forth semiconductor layers, (c) growing a fifth semiconductor layer on the InP substrate on which the mesa stripe is formed, as a lowest surface height of the fifth semiconductor layer from a surface of the substrate is higher than the fourth semiconductor layer, and (d) etching a surface of the fifth semiconductor layer by an etchant including hydrochloric acid and acetic acid.

A further object of the present invention is to provide a method of manufacturing a semiconductor device, including the steps of (a) forming a semiconductor structure in which first to fourth semiconductor layers are grown, wherein the first semiconductor layer made of n-type InP is grown on a n-type InP substrate, the second semiconductor layer having a smaller band gap energy than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure in which the semiconductor layers are grown, and thereby a mesa stripe is formed on part including at least the second to forth semiconductor layers, (c) growing a fifth semiconductor layer on the InP substrate on which the mesa stripe is formed, as a lowest surface height of the fifth semiconductor layer from a surface of the substrate is higher than the fourth semiconductor layer and as the mesa stripe is covered with the fifth semiconductor layer, and (d) etching a surface of the fifth semiconductor layer by an etchant including hydrochloric acid and acetic acid.

A further object of the present invention is to provide a method of manufacturing a semiconductor device, including the steps of (a) forming a semiconductor structure in which first to third semiconductor layers are grown, wherein the first semiconductor layer made of n-type InP is grown on a n-type InP substrate, the second semiconductor layer having a smaller band gap than InP is grown on the first semiconductor layer, and the third semiconductor layer made of p-type InP is grown on the second semiconductor layer, (b) etching the semiconductor structure by using a protection pattern formed on the semiconductor structure as a mask, and thereby a mesa stripe including at least the second and third semiconductor layers is formed, (c) growing a forth semiconductor layer made of p-type InP on the InP substrate on which the mesa stripe is formed, as a lowest surface height of the fourth semiconductor layer from a surface of the substrate is higher than an upper surface of the second semiconductor layer and lower than the third semiconductor layer, (d) etching a surface of the fourth semiconductor layer by an etchant including hydrochloric acid and acetic acid, (e) growing a fifth semiconductor layer made of n-type InP on the fourth semiconductor layer, (f) removing the protection pattern used as a mask in the step of (a) by etching, and (g) growing a sixth semiconductor layer made of p-type InP on the third and fifth semiconductor layers, and growing a seventh semiconductor layer of InGaAs or InGaAsP on the sixth semiconductor layer.

A further object of the present invention is to provide a method of manufacturing a semiconductor device, including the steps of (a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure by using a protection pattern formed on the semiconductor structure as a mask, and thereby a mesa stripe including at least the second to fourth semiconductor layers is formed, (c) removing the protection pattern by etching, (d) growing a fifth semiconductor layer made of p-type InP on the substrate where the mesa stripe is formed, as a lowest surface height of the fifth semiconductor layer from a surface of the substrate is higher than the second semiconductor layer and is lower than the fourth semiconductor layer and as the mesa stripe is included, (e) etching a surface of the fifth semiconductor layer by an etchant including hydrochloric acid and acetic acid, (f) growing a sixth semiconductor layer made of n-type InP on the fifth semiconductor layer, as a lowest surface height of the sixth semiconductor layer from a surface of the substrate is lower than the fourth semiconductor layer, (g) etching a surface of the sixth semiconductor layer by an etchant including hydrochloric acid and acetic acid, (h) growing a seventh semiconductor layer made of p-type InP, as a lowest surface height of the seventh semiconductor layer from a surface of the substrate is higher than the forth semiconductor layer, and (i) etching a surface of the seventh semiconductor layer by an etchant including hydrochloric acid and acetic acid.

A further object of the present invention is to provide a method of manufacturing a semiconductor device, including the steps of (a) forming a semiconductor structure in which first to fourth semiconductor layers are grown, wherein the first semiconductor layer made of n-type InP is grown on an n-type InP substrate, the second semiconductor layer having a smaller band gap energy than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure by using a protection pattern formed on the semiconductor structure as a mask, and thereby a mesa stripe including at least the second to fourth semiconductor layers is formed, (c) removing the protection pattern by etching, (d) growing a fifth semiconductor layer made of p-type InP on the substrate where the mesa stripe is formed, as a lowest surface height of the fifth semiconductor layer from a surface of the substrate is higher than the second semiconductor layer and lower than the fourth semiconductor layer and as the mesa stripe is included, (e) etching a surface of the fifth semiconductor layer by an etchant including hydrochloric acid and acetic acid, (f) growing a sixth semiconductor layer made of n-type InP on the fifth semiconductor layer, and growing a seventh semiconductor layer made of p-type InP on the sixth semiconductor layer, (g) etching a surface of the seventh semiconductor layer by an etchant including hydrochloric acid and acetic acid, (h) removing the fourth semiconductor layer by etching, and (i) growing an eighth semiconductor layer made of p-type InP, and growing a ninth semiconductor layer made of InGaAs or InGaAsP on the eighth semiconductor layer.

A further object of the present invention is to provide a method of manufacturing a semiconductor device, including the steps of (a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure, and thereby a mesa stripe including at least the second to fourth semiconductor layers is formed, (c) growing a fifth semiconductor layer on the substrate where the mesa stripe is formed, as a contact part height between the fifth semiconductor layer and the mesa stripe from a surface of the substrate is higher than the second semiconductor layer and lower than the fourth semiconductor layer and as the mesa stripe is included, (d) growing a sixth semiconductor layer made of p-type InP on the fifth semiconductor layer, and (e) etching a surface of the sixth semiconductor layer by an etchant including hydrochloric acid and acetic acid.

A further object of the present invention is to provide a method of manufacturing a semiconductor device, including the steps of (a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure by using a protection pattern formed on the semiconductor structure as a mask, and thereby a mesa stripe including the third and fourth semiconductor layers is formed, (c) removing the protection pattern by etching, (d) growing a fifth semiconductor layer made of n-type InP on the substrate where the mesa stripe is formed, as a lowest surface height of the fifth semiconductor layer from a surface of the substrate is lower than the fourth semiconductor layer, (e) etching a surface of the fifth semiconductor layer by an etchant including hydrochloric acid and acetic acid, (f) growing a sixth semiconductor layer made of p-type InP on the fifth semiconductor layer, as a lowest surface height of the sixth semiconductor layer from a surface of the substrate is higher than the fourth semiconductor layer, and (g) etching a surface of the sixth semiconductor layer by an etchant including hydrochloric acid and acetic acid.

A further object of the present invention is to provide a method of manufacturing a semiconductor device, including the steps of (a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer, (b) etching the semiconductor structure, and thereby a mesa stripe including the third and fourth semiconductor layers is formed, (c) growing a fifth semiconductor layer made of n-type InP on the substrate where the mesa stripe is formed, as a highest part height of the fifth semiconductor layer from a surface of the substrate is lower than the fourth semiconductor layer, (d) etching a surface of the fifth semiconductor layer by an etchant including hydrochloric acid and acetic acid, (e) growing a sixth semiconductor layer made of p-type InP on the fifth semiconductor layer, as a lowest part height of the sixth semiconductor layer from a surface of the substrate is higher than the forth semiconductor layer, and (f) etching a surface of the sixth semiconductor layer by an etchant including hydrochloric acid and acetic acid.

A further object of the present invention is to provide a method of manufacturing an optical wave guide, including the steps of (a) forming a semiconductor structure, wherein the first semiconductor layer made of InP is grown on an InP substrate, the second semiconductor layer having a larger refractive index than a refractive index of the first semiconductor layer is grown on the first semiconductor layer, and the third semiconductor layer made of InP is grown on the second semiconductor layer, (b) etching the semiconductor structure by using a protection pattern formed on the semiconductor structure as a mask, and thereby a mesa pattern including at least the second and third semiconductor layers is formed, (c) growing a fourth semiconductor layer made of InP on the substrate where the mesa stripe is formed in a state where the protection pattern is shouldered by the mesa pattern, (d) etching a surface of the fourth semiconductor layer in a state where the protection pattern is shouldered by the mesa pattern, by an etchant including hydrochloric acid and acetic acid, (e) removing the protection pattern, and (f) growing a fifth semiconductor layer made of InP.

A further object of the present invention is to provide a method of manufacturing an optical wave guide, including the steps of (a) forming a semiconductor structure, wherein a first semiconductor layer made of InP is grown on an InP substrate, a second semiconductor layer having a larger refractive index than a refractive index of the first semiconductor layer is grown on the first semiconductor layer, a third semiconductor layer made of InP is grown on the second semiconductor layer, and a fourth semiconductor layer made of InGaAs or InGaAsP is grown on the third semiconductor layer, (b) forming a mesa pattern including at least the second to fourth semiconductor layers by etching the semiconductor structure, (c) growing a fifth semiconductor layer made of InP on the substrate where the mesa pattern is formed, as the mesa pattern is covered, and (d) etching a surface of the fifth semiconductor layer by an etchant including hydrochloric acid and acetic acid.

A further object of the present invention is to provide a method of manufacturing a semiconductor device, including the steps of (a) forming a selective growth mask on an InP substrate, (b) forming a semiconductor pattern by selectively growing a first semiconductor layer made of InP on an InP substrate where the selective growth mask is formed, selectively growing a second semiconductor layer having a smaller band gap than InP on the first semiconductor layer, and selectively growing a third semiconductor layer made of InP on the second semiconductor layer, and (c) etching a surface of the third semiconductor layer by etchant including hydrochloric acid and acetic acid.

A further object of the present invention is to provide a method of manufacturing a semiconductor device, including the steps of (a) forming a selective growth mask on an InP substrate, (b) forming a groove by etching uncovered area by the selective etching mask on a surface of the InP substrate, (c) forming a semiconductor structure by growing a first semiconductor layer made of InP on the substrate, growing a second semiconductor layer having a smaller band gap than InP on the first semiconductor layer, and growing a third semiconductor layer made of InP on the second semiconductor layer, in a state where the selective growth mask is formed on the substrate, (d) removing the selective growth mask, and (e) etching a surface of the third semiconductor layer by etchant including hydrochloric acid and acetic acid.

A further object of the present invention is to provide a method of manufacturing a multiple layer optical wave guide, comprising the steps of (a) forming a first growing semiconductor structure by growing a first semiconductor layer made of InP on an InP substrate, growing a second semiconductor layer having a smaller band gap than InP on the first semiconductor layer, and growing a third semiconductor layer made of InP on the second semiconductor layer, (b) forming a first mesa stripe including at least the second and third semiconductor layers by forming a first protection pattern on the first growing semiconductor structure and etching the first growing semiconductor structure with the first protection pattern as a mask, (c) growing a fourth semiconductor layer made of InP having a high resistance on the substrate where the first mesa stripe is formed, in a state where the first protection pattern remains on the first mesa stripe, (d) etching a surface of the fourth semiconductor layer by etchant including hydrochloric acid and acetic acid, (e) removing the first protection pattern, (f) forming a second semiconductor structure by growing a fifth semiconductor layer made of InP on the fourth semiconductor layer, growing a sixth semiconductor layer having a smaller band gap than InP on the fifth semiconductor layer, and growing a seventh semiconductor layer made of InP on the sixth semiconductor layer, (g) forming a second mesa stripe including at least the sixth and seventh semiconductor layers by forming a second protection pattern on the second growing semiconductor structure and etching the second growing semiconductor structure with the second protection pattern as a mask, (h) growing an eighth semiconductor layer made of InP on the first semiconductor structure where the second mesa stripe is formed, in a state where the second protection pattern remains on the second mesa stripe, (i) etching a surface of the eighth semiconductor layer by etchant including hydrochloric acid and acetic acid, and (j) removing the second protection pattern by etching.

According to the above invention, it is possible to flatten a convex structure generated at an InP layer based on a crystal growth, by wet-etching with an etchant including hydrochloric acid and acetic acid. Besides, it is possible to make a position of the flat surface correspond with a lowest surface part of the step structure.

Other objects, features, and advantages of the present invention will be more apparent from the following detailed description when read in conjunction with the accompanying drawings.

BRIEF DESCRIPTION OF THE DRAWINGS

FIG. 3-(B) is a view for explaining a manufacturing process of an optical wave guide;

FIG. 3-(C) is a view for explaining a manufacturing process of an optical wave guide;

DETAIL DESCRIPTION OF THE PREFERRED EMBODIMENTS

A description regarding embodiments according to the present invention will now be given, with reference of FIGS. 6 to 29.

Figure 6:
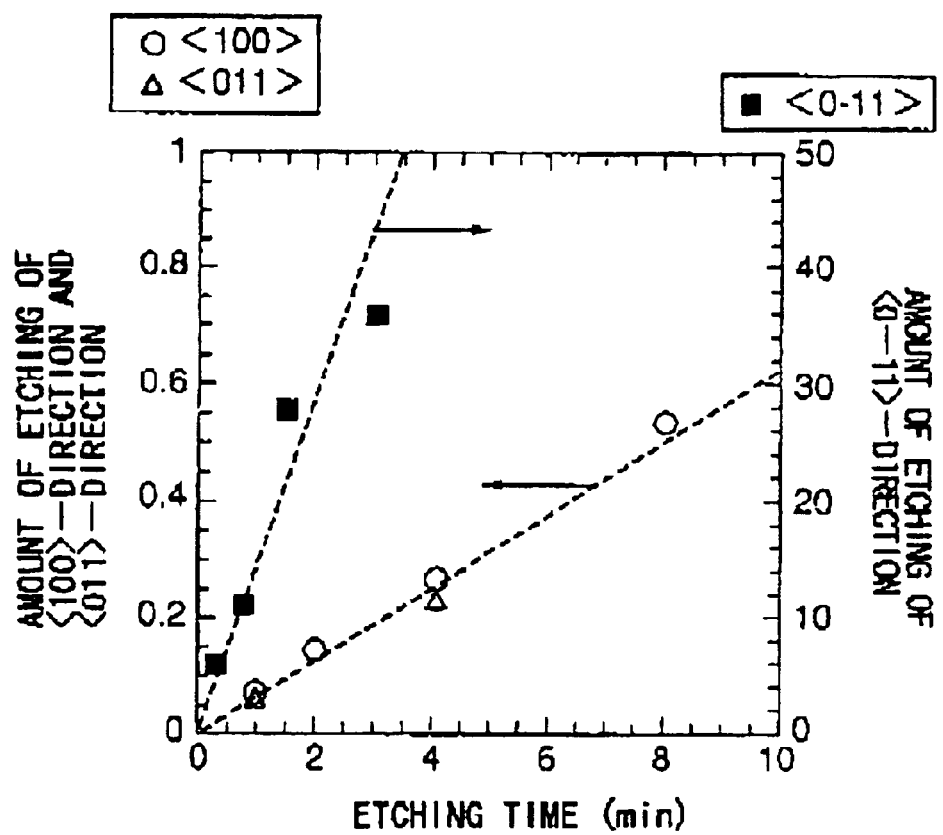
FIG. 6 is a view for explaining a principle of the present invention.

FIG. 6 is a view for explaining a relation between etching amounts of a <100>-direction, a <0-11>-direction, and a <011>-direction and an etching time in which an experiment of etching an InP layer having a convex structure is implemented by using a mixed liquid in an experiment of inventors of the present invention. A mixture ratio of hydrochloric acid, acetic acid, and water in the mixed liquid is 1:5:1.

Referring to FIG. 6, etching speeds in the <100>-direction and the <011>-direction are approximately 0.05 to 0.7 mm/min. An etching speed to the <0-11>-direction is approximately 5 to 30 mm/min and approximately 100 times higher than the etching speeds to the <100>-direction and the <011>-direction. Therefore, if the convex structure of the InP layer is etched by the mixed liquid, a convex of the <0-11>-direction is etched with a greatly high rate. As a result of this, a (100)-surface, a (011)-surface, and a (0-1-1)-surface which is equivalent to the (100)-surface and the (011)-surface remain and other surfaces vanish. That is, inventors realized that the (100)-surface, the (011)-surface, or the (0-1-1)-surface appears as a flat surface on the InP layer by wet-etching with the above-mentioned etching liquid.

If the mixture ratio of respective ingredients in the above-mentioned etchant is changed, an absolute value of the etching rate and relative rates to respective surface directions are changed.

Figure 7:
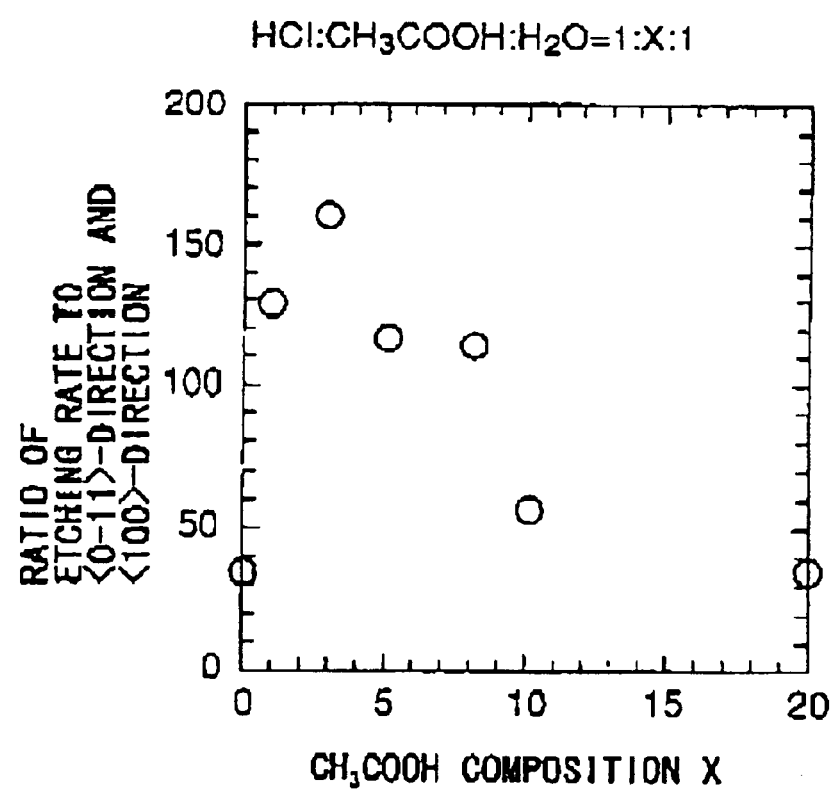
FIG. 7 is a view for explaining a principle of the present invention.

FIG. 7 is a view for explaining the relationship between a concentration ratio X of acetic acid to hydrochloric acid and an etching rate ratio of the <0-11>-direction to the <100>direction. That is, the mixture ratio in the etchant of hydrochloric acid, acetic acid, and water is expressed as 1:X:1.

Referring to FIG. 7, the etching rate in the <0-11>-direction is approximately 30 to 100 times higher than the etching rate to the <100>-direction in an a concentration area X of acetic acid. Such an etching anisotropy is caused by contents of hydrochloric acid and acetic acid in the etchant. Particularly, it is recognized that an etching rate ratio of 30 or more is achieved in an area of the concentration ratio X in a range of 1 to 10 of hydrochloric acid and acetic acid. Thus, it is possible to carry out an object of the present invention, namely to flatten the InP layer remarkably, by setting the concentration of acetic acid in the above-mentioned area in the etchant.

If a concentration of water in the etchant is changed, the concentrations of hydrochloric acid and acetic acid are changed, and thereby an absolute value of the etching rate is changed. However, the etching anisotropy shown in FIGS. 6 and 7 is not changed and there is no influence to flatten the InP layer.

The etching anisotropy by the etchant of the present invention can be achieved by adding hydrogen peroxide water to the above-mentioned etchant mixed liquid.

Figure 8:
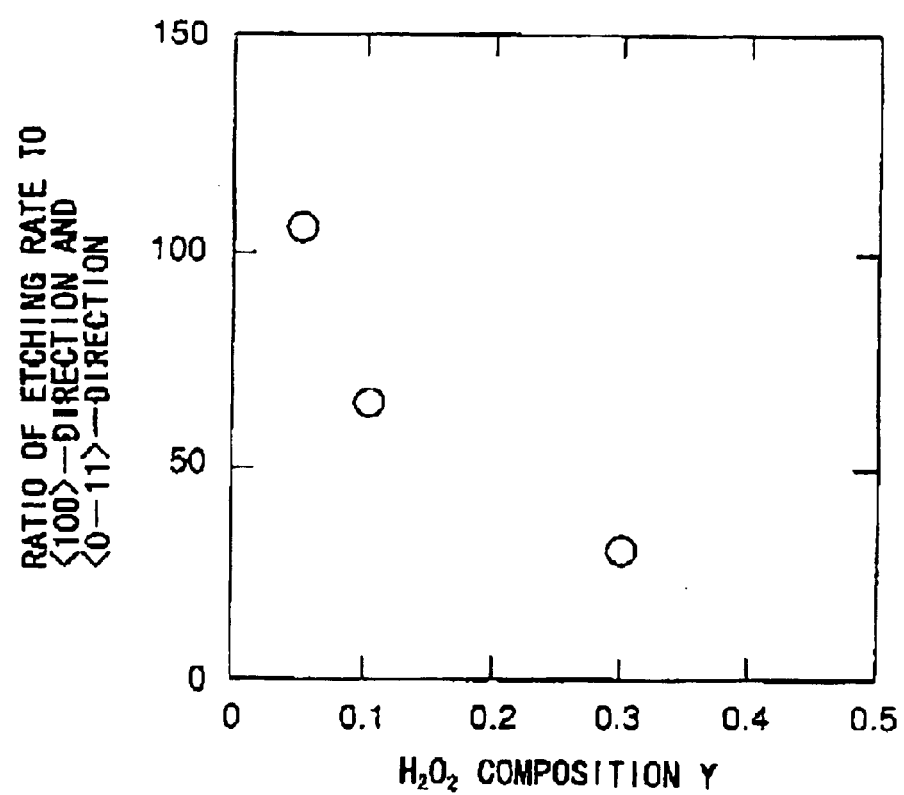
FIG. 8 is a view for explaining a principle of the present invention.

FIG. 8 is a view for explaining a ratio of a <0-11>-direction etching rate to a <100>-direction etching rate when the convex structure of the InP layer is etched by an etchant of the mixed liquid including hydrochloric acid, acetic acid, and water and added hydrogen peroxide water.

Referring to FIG. 8, an etching anisotropy of 30 or more is achieved when a composition Y of hydrogen peroxide water is in a range of 0 to 0.3, where the mixture ratio in the etchant of hydrochloric acid, acetic acid, hydrogen peroxide water, and water is 1:1:Y:1.

Figure 9A:
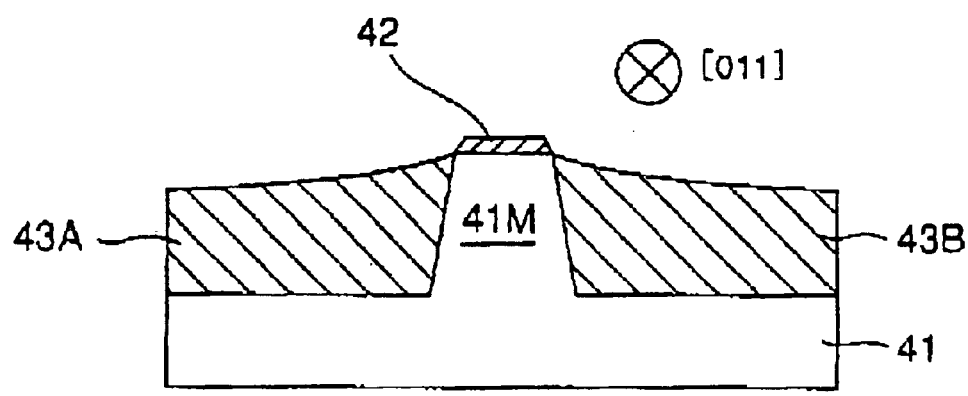
FIG. 9A is a view for explaining a principle of the present invention.
Figure 9B:
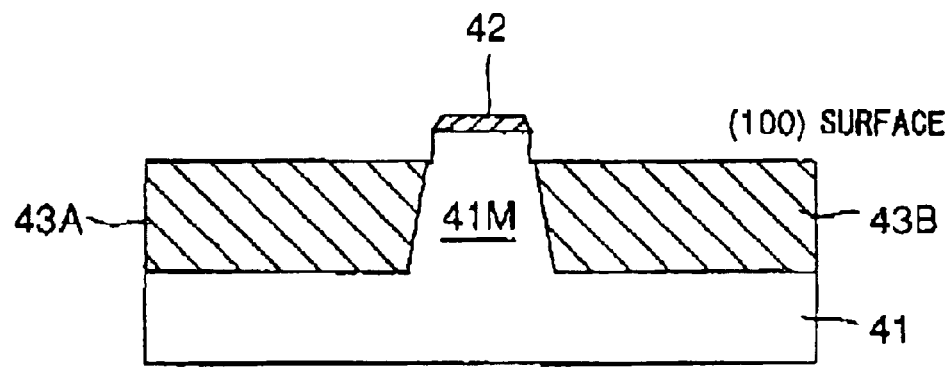
FIG. 9B is a view for explaining a principle of the present invention.

According to the experiment, it was realized that a side etching was not generated under the etching mask, if the etchant of the present invention including hydrochloric acid and acetic acid was applied to a structure in which a SiO$_2$ etching mask shown in FIG. 9A was formed on a surface of the convex structure of the InP layer and the InP layer was flattened as shown in FIG. 9B.

Referring to FIG. 9A, a mesa stripe 41M is formed in a [011] direction on an InP substrate by using a SiO$_2$ pattern 42 as an etching mask. InP buried layers 43A and 43B are formed at both sides of the mesa stripe 41M by using the SiO$_2$ pattern 42 on the mesa stripe 41M as a selective growth mask.

In a process shown in FIG. 9B, the InP buried layers 43A and 43B are etched by using the etchant of the present invention including hydrochloric acid and acetic acid and using the SiO$_2$ pattern 42 as an etching mask. Thereby, a flat surface formed by the (100) surface is formed.

In the process shown in FIG. 9B, even if a side wall surface of the above-mentioned mesa stripe 41M is the (0-11) surface of the InP layer etched selectively by the above-mentioned etchant, a substantial side etching is not generated at the mesa stripe 41M as long as the SiO$_2$ pattern 42 is formed on the mesa stripe 41M. Therefore, the inventors realized that the mesa stripe 41M remains substantially perfect after a flattening process shown in FIG. 9B is completed.

That is, in the present invention, during the process of flattening of a convex structure of the InP layer by the etchant including hydrochloric acid and acetic acid, a part of the surface of the convex structure of the InP layer is covered with the mask. Thereby, a convex part covered with the mask intentionally remains. An area which is not covered with the mask is etched by the above-mentioned etchant, and thereby it is possible to make the area, such as flattening the (100) surface, the (011) surface, or the (0-1-1) surface selectively.

On the other hand, even if the etching mask is formed on the (100) surface, the (011) surface, and the (0-1-1) surface which do not have convex structures and the above-mentioned structure is etched by the mixed liquid of the present invention, the object of the present invention which is flattening of the InP layer, is not achieved. In order for the selective flattening of the present invention to be effective, at least part of an area not covered by the mask should be located lower than the area where the etching mask is formed.

An etching rate by using the etchant of the present invention including hydrochloric acid and acetic acid in a compound semiconductor including Ga or As such as InGaAsP or InGaAs is extremely lower than an etching rate in the InP layer. Particularly, if the etchant does not include the hydrogen peroxide water, such a semiconductor layer is not etched substantially. Therefore, as an above-described etching mask for flattening selectively, a compound semiconductor layer including Ga or As such as InGaAsP or InGaAs can be used as well as SiO$_2$ and SiN.

Next, a description will be given with regard to a convex structure to which the flattening by use of the etchant of the present invention as described above can be applied effectively.

A. Flattening the Convex Structures Formed at Edges of a Selective Growth Mask

Figure 10A:
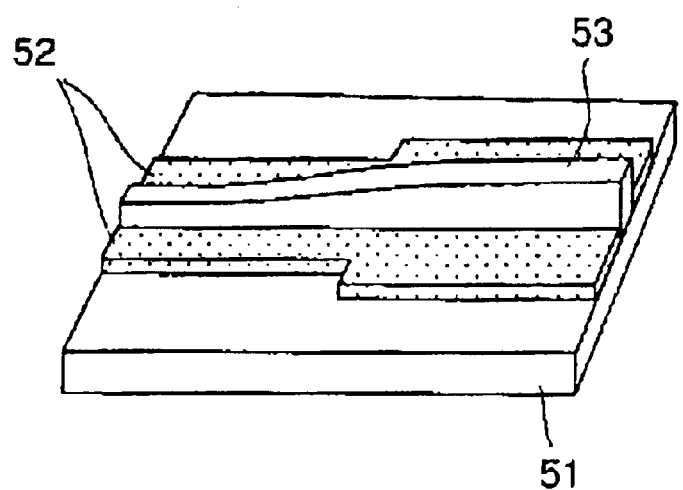
FIG. 10A is a view for explaining a principle of the present invention.
Figure 10B:
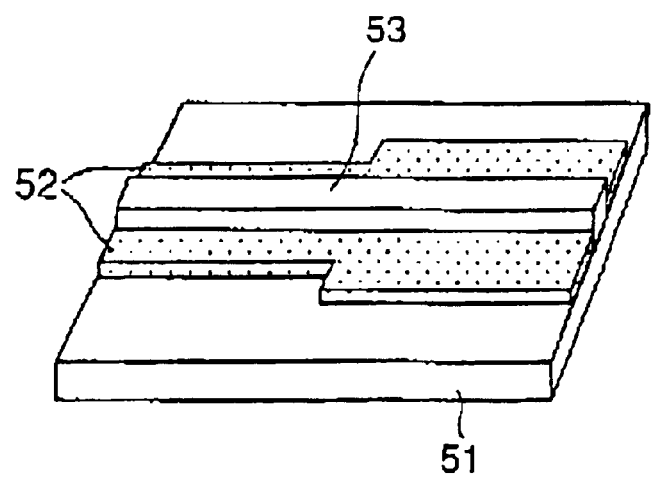
FIG. 10B is a view for explaining a principle of the present invention.

FIGS. 10A and 10B are views for explaining a state in which an InP layer 53 grows by using a SiO$_2$pattern 52 formed on an n-type InP substrate 51 as a selective growth mask and the InP layer 53 is flattened by an etchant including hydrochloric acid and acetic acid.

If a vapor deposition of the semiconductor layer is implemented on the substrate by using such a selective growth mask 52, a material is provided excessively to edges of the mask 52. As a result of this, a growth rate of the semiconductor layer is increased.

Figure 11A:
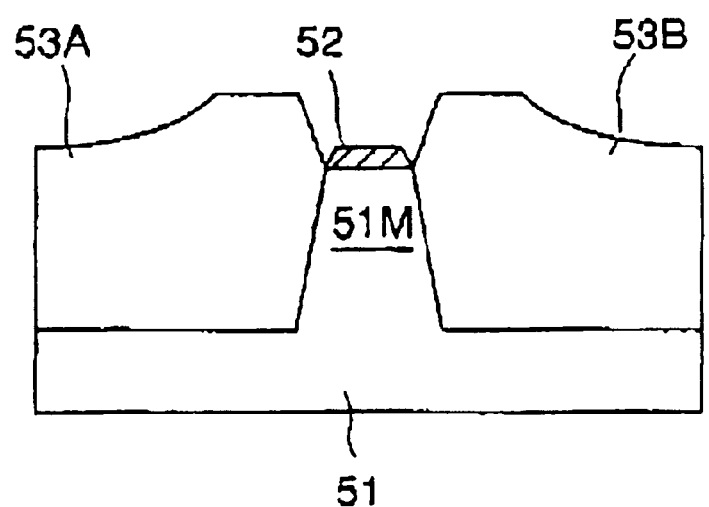
FIG. 11A is a view for explaining a principle of the present invention.
Figure 11B:
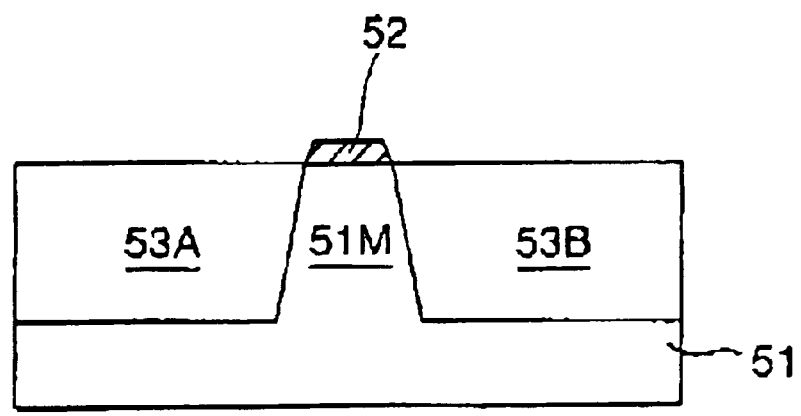
FIG. 11B is a view for explaining a principle of the present invention.

FIGS. 11A and 11B are views for explaining a state in which the SiO$_2$ pattern 52 is formed on a convex part of the mesa stripe formed on the above mentioned InP substrate 51, and InP buried layers 53A and 53B grown at both sides of the convex part by using the SiO$_2$ pattern 52 as a selective growth mask. In this state, as described above, the InP buried layers 53A and 53B bulge at both sides of the selective growth mask 52 as a result of the increase of the material density on the selective growth mask 52.

Figure 12A:
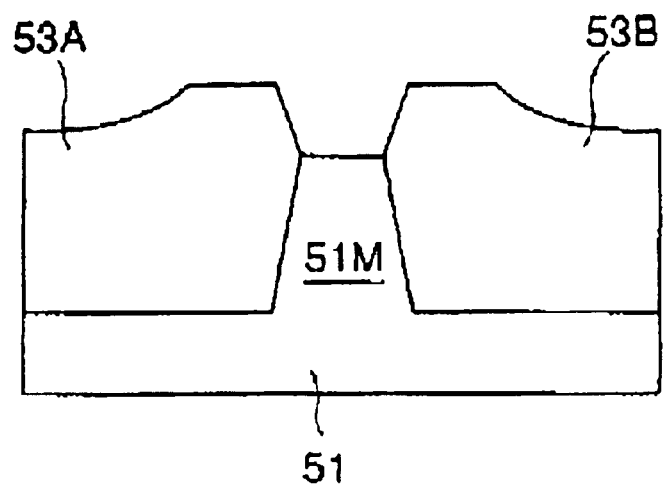
FIG. 12A is a for explaining a principle of the present invention.
Figure 12B:
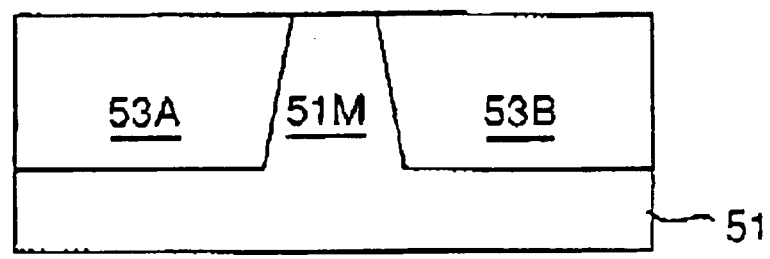
FIG. 12B is a view for explaining a principle of the present invention.

Therefore, as shown in FIG. 11B, a wet etching process in which an etchant of the present invention including hydrochloric acid and acetic acid is used is applied to a structure shown in FIG. 11A and thereby the InP buried layers 53A and 53B are flattened. In the process shown in FIGS. 11A and 11B, the selective growth mask 52 is used as an etching mask. Even if the selective growth mask 52 is removed by etching prior to the flattening process, an equivalent effect can be achieved as shown in FIGS. 12A and 12B.

B. Flattening Convex Structures Reflecting Concave Structures Prior to the Growth FIGS. 13A and 13B are views for showing a process of flattening concave and convex parts formed on the surface of the InP layer in the case of that the InP layer grows in a structure having a concave structure.

Figure 13A:
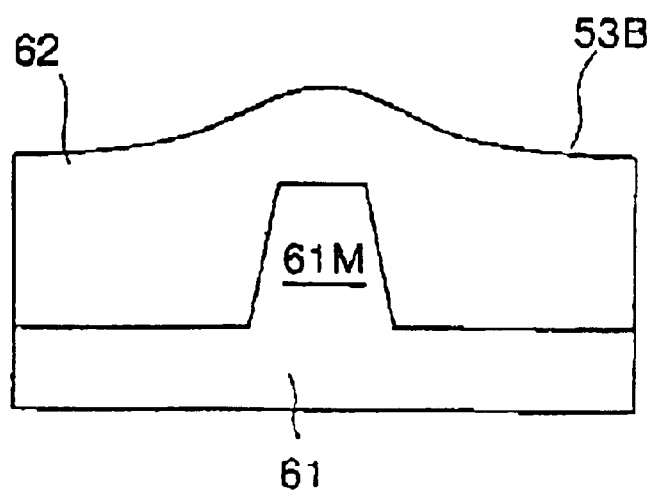
FIG. 13A is a view for explaining a principle of the present invention.

Referring to FIG. 13A, a mesa structure 61M is formed on an n-type InP substrate 61. An InP layer 62 is grown on the substrate 61 as it covers the mesa structure 61M. As a result of this, a convex part corresponding to the mesa structure 61M is formed on a surface of the InP layer 62.

Figure 13B:
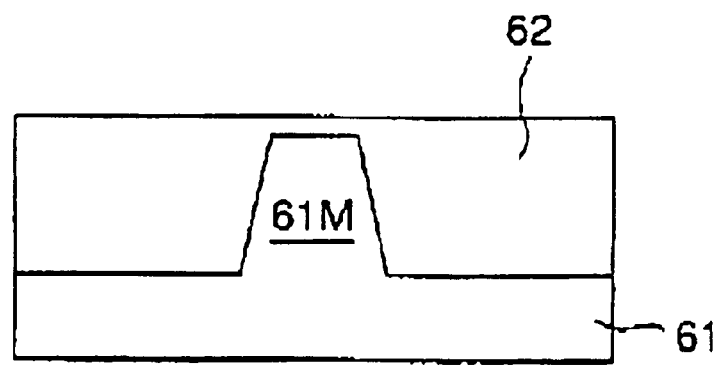
FIG. 13B is a view for explaining a principle of the present invention.

Therefore, in a process shown in FIG. 13B, wet etching is implemented to the InP layer 62 by the etchant including hydrochloric acid and acetic acid, and thereby a surface of the InP layer 62 is flattened.

Figure 14A:
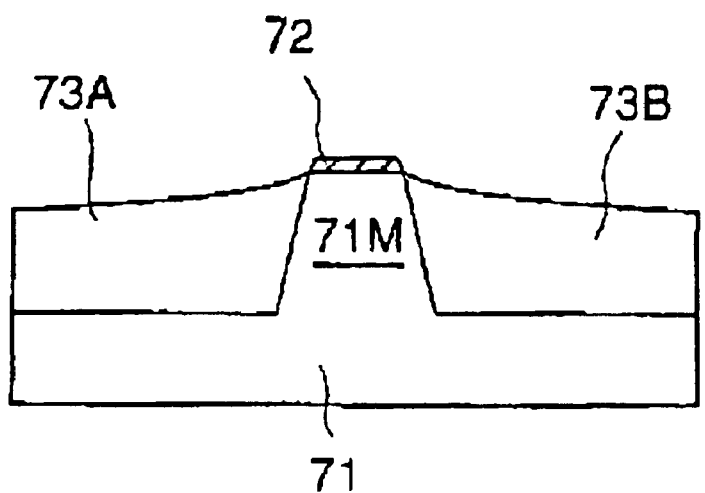
FIG. 14A is a view for explaining a principle of the present invention.
Figure 14B:
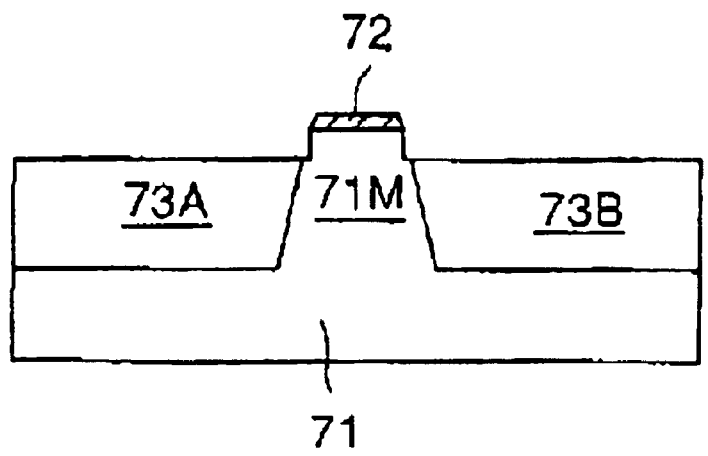
FIG. 14B is a view for explaining a principle of the present invention.

C. Flattening Concave Structures Formed on a Surface of a Growth Layer not Exceeding the Height of a Mask FIGS. 14A and 14B are views for explaining a state in which a slope surface formed on a surface of the buried InP layer adjacent to a convex part formed on the substrate is flattened by a wet etching of the present invention when a buried InP layer grows on a substrate by using a selective growth mask. Such a slope surface is generated in case of the buried InP layer is formed at a lower position than a height of the selective growth mask.

Referring to FIG. 14A, a mesa structure 71M is formed on an n-type InP substrate 71 by using an $SiO_2$ pattern 72 as an etching mask. Besides, InP buried layers 73A and 73B are formed at the both sides of the mesa structure 71M by using the $SiO_2$ pattern 72 as a selectively growth mask. At that time, the InP layers 73A and 73B have heights which do not exceed the mesa structure 71M. A descent slope surface is formed on a side of the mesa structure 71M, because a vapor material becomes excessive when the InP buried layers 73A and 73B selectively grows on the selective growth mask 72.

In a process shown in FIG. 14B following the process shown in FIG. 14A, a wet etching process, in which the etchant of the present invention including hydrochloric acid and acetic acid is used, is applied, and thereby the buried InP layers 73A and 73B are flattened.

D. Flattening Concave Structures Including a Semiconductor Layer as an Etching Mask As described above, a semiconductor including InGaAsP, InGaAs, Ga, or As has a quite late etching rate in case of the wet etching by using the etchant of the present invention including hydrochloric acid and acetic acid, as compared to the InP. Therefore, when the InP layer is flattened by using the etchant of the present invention, it is possible to use such InGaAsP or InGaAs semiconductor film as an etching mask.

Figure 15A:
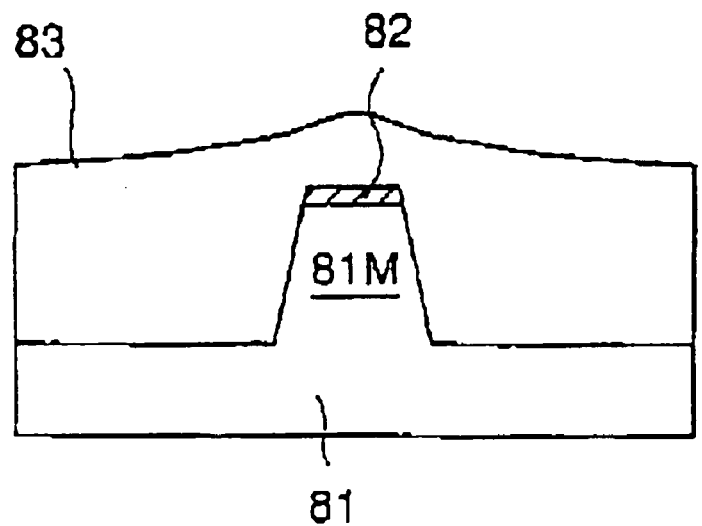
FIG. 15A is a view for explaining a principle of the present invention.

FIG. 15A is a view for explaining a state in which a mesa structure 81M shouldering an InGaAsP pattern 82 is formed on an n-type InP substrate 81, and an InP buried layer 83 is grown as it covers the mesa structure 81M and the InGaAsP pattern 82.

Figure 15B:
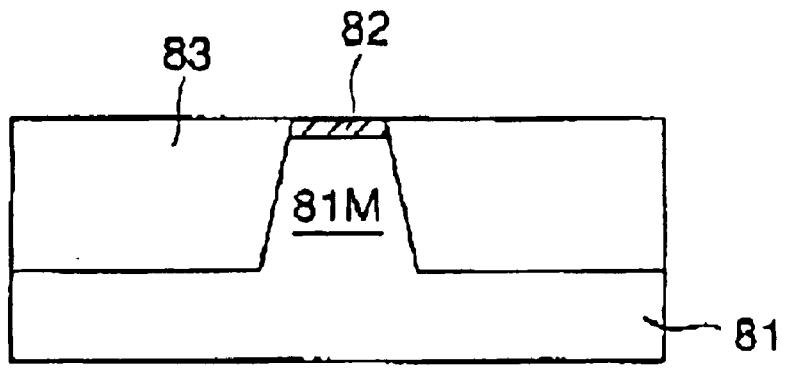
FIG. 15B is a view for explaining a principle of the present invention.

A wet etching process, in which an etchant of the present invention including hydrochloric acid and acetic acid is used, is applied to a structure shown in FIG. 15A by using the InGaAsP pattern 82 as an etching mask as shown in FIG. 15B, and thereby it is possible to flatten the InP buried layer 83 as a surface of the InP buried layer 83 corresponds to a surface of the InGaAsP pattern 82.

Figure 16A:
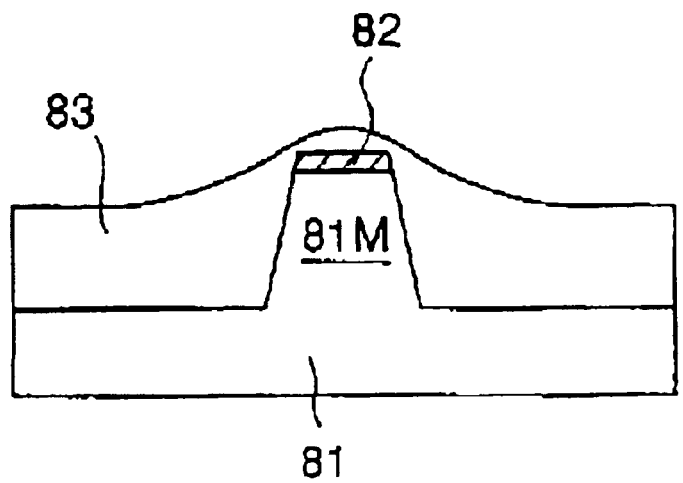
FIG. 16A is a view for explaining a principle of the present invention.
Figure 16B:
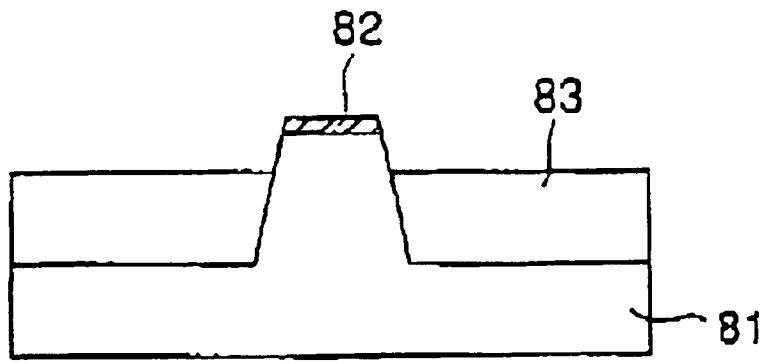
FIG. 16B is a view for explaining a principle of the present invention.

Alternatively, as shown in FIGS. 16A and 16B, it is also possible to etch the InP buried layer 83 to such a depth as to reveal a portion below the InGaAsP pattern 82.

In the above description, flattening is defined as the formation of a surface comprised of at lease one of the (100) surface, the (011) surface, or the (0-1-1) surface in the InP layer as a result of applying a wet etching in which the etchant including hydrochloric acid and acetic acid is used to a concave structure formed by the growth of an InP layer. However, in the initial process of etching, a slope surface having a surface direction between the surface directions a slope surface and one of the (100) surface, the (011) surface, and the (0-1-1) surface appears, and changes gradually to one of the (100) surface, the (011) surface, and the (0-1-1) surface as the etching process. Therefore, flattening in the present invention is effective for a manufacturing process of an actual semiconductor device not only when the concave surface changes all the way to the (100) surface, the (011) surface, or the (0-1-1) surface but also when the concave surface stops changing halfway. That is, flattening in the present invention includes a case in which the InP concave surface not only changes into the (100) surface, the (011) surface, or the (0-1-1) surface but also is an intermediate slope surface.

Meanwhile, the etchant itself including hydrochloric acid, acetic acid, and hydrogen peroxide water has already been known to public. For instance, a Japanese Laid-Open Patent Application No. 10-65201 discloses an example in which an etchant including hydrochloric acid, acetic acid, and hydrogen peroxide water is used during a process of forming a mesa stripe. However, the etchant in the above patent application is used for arranging a side wall part of a convex part in a prior state to the crystal growth for a designated slope. Hence, it is not possible to assume that the etchant can be used for an effect of the present invention, namely flattening a concave surface formed by the crystal growth.

Furthermore, a Japanese Laid-Open Patent Application No. 2000-91303 discloses an example in that a side wall part of a mesa stripe formed by dry etching with the etchant including hydrochloric acid, acetic acid, and hydrogen peroxide water. However, it is an object of an invention of the above patent application to eliminate a damage of a surface of the mesa stripe generated by the dry etching. Hence, it is not possible to assume that the etchant can be used for an effect of the present invention, namely flattening a concave structure formed by the crystal growth.

A description regarding a first embodiment of a manufacturing process of a laser diode having a BH structure according to the present invention will now be given, with reference of FIGS. 17A to 17E.

Figure 17A:
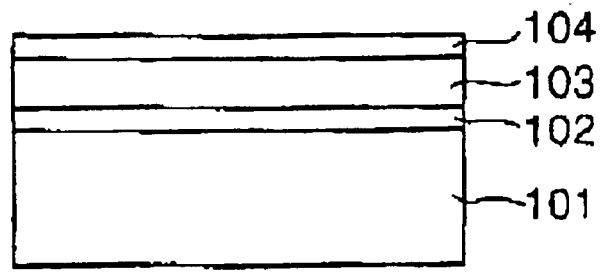
FIG. 17A is a view of a manufacturing process of a laser diode of a first embodiment according to the present invention.

Referring to FIG. 17A, an InGaAsP/InGaAsP multi-quantum well active layer 102 is grown on an n-type InP substrate 101, a p-type InP clad layer 103 is grown on the InGaAsP/InGaAsP multi-quantum well active layer 102, and a p-type InGaAs contact layer 104 is grown on the p-type InP clad layer 103.

Figure 17B:
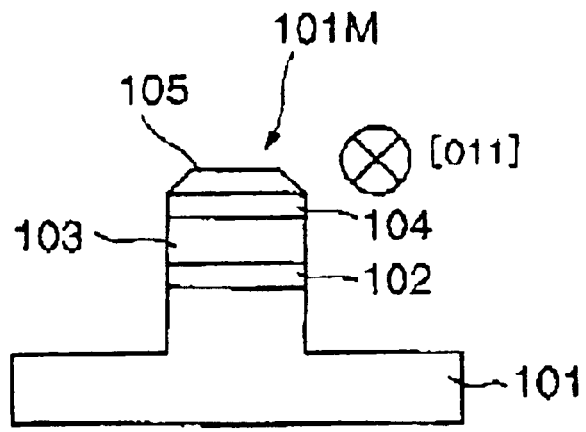
FIG. 17B is a view of a manufacturing process of a laser diode of a first embodiment according to the present invention.

In a process shown in FIG. 17B following the step shown in FIG. 17A, an active layer mesa stripe 101M is formed by dry etching with a $SiO_2$ film 105 as an etching mask. In an example shown in FIG. 17B, the active layer mesa stripe 101M is extended to a <011>-direction.

Figure 17C:
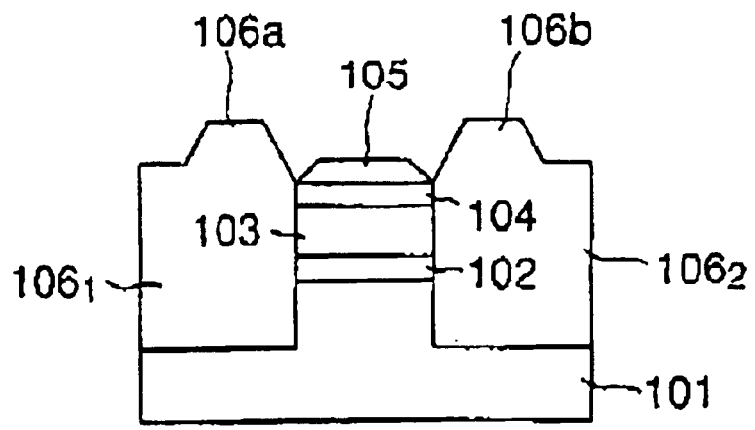
FIG. 17C is a view of a manufacturing process of a laser diode of a first embodiment according to the present invention.

In a process shown in FIG. 17C following the step shown in FIG. 17B, Fe doped InP buried layers $106_1$ and $106_2$ grow at both sides of the mesa stripe 101M on the substrate 101 by the MOVPE method with the $SiO_2$ film 105 as a selective growth mask. The MOVPE process is implemented, in a state of a growth temperature of 630 and a growth pressure of 0.1 atmospheres, by using an element in a III group, an element in a V group, TMIn, $PH_3$, and $Cp_2Fe$ as a material of a Fe dopant. In this embodiment, the thickness of the InP buried layers 106A and 106B are set as lowest parts of the InP buried layers $106_1$ and $106_2$ locate at higher positions than the a p-type InGaAs contact layer 104. As a result of this, bulge parts 106a and 106b are formed on the InP buried layers $106_1$ and $106_2$. The bulge parts 106a and 106b are adjacent to the $SiO_2$ film 105 on the mesa stripe 101M.

Figure 17D:
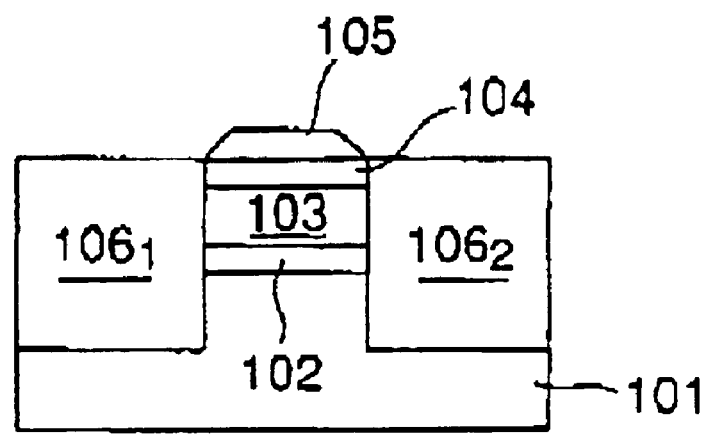
FIG. 17D is a view of a manufacturing process of a laser diode of a first embodiment according to the present invention.

In a process shown in FIG. 17D following the process shown in FIG. 17C, wet etching is implemented by an etchant including hydrochloric acid, acetic acid, and water.

In the process shown in FIG. 17D, the mixture ratio of hydrochloric acid, acetic acid, and water in the etchant is set as 1:5:1. Typically, etching is carried out for 3 minutes at a liquid temperature of 23. As a result of the etching, surfaces of the InP buried layers 106A and 106B become (100) surfaces as shown in FIG. 17D, and are flattened at a height of the p-type InGaAs layer 104.

Figure 17E:
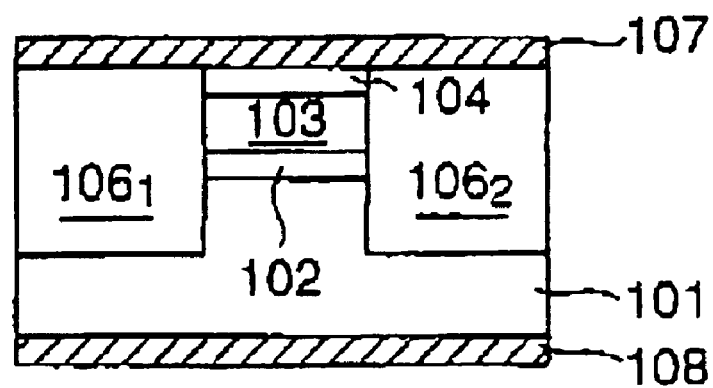
FIG. 17E is a view of a manufacturing process of a laser diode of a first embodiment according to the present invention.

In a process shown in FIG. 17E following the step shown in FIG. 17D, a structure shown in FIG. 17D is immersed in the hydrofluoric acid in one minute, and thereby the $SiO_2$ film 105 is removed by etching. After that, a p-side electrode 107 is formed on the p-type InGaAs layer 104 and an n-side electrode 108 is formed on a bottom surface of the substrate 101.

Figure 1A:
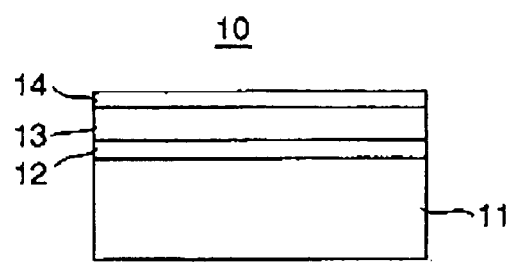
FIG. 1A is a view for explaining a manufacturing process of a laser diode having a buried hetero structure according to a related art.
Figure 1B:
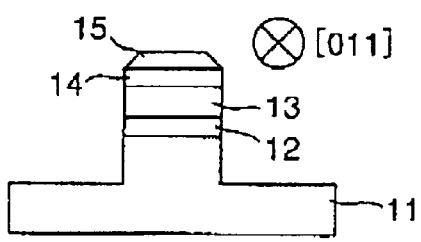
FIG. 1B is a view for explaining a manufacturing process of a laser diode having a buried hetero structure according to a related art.
Figure 1C:
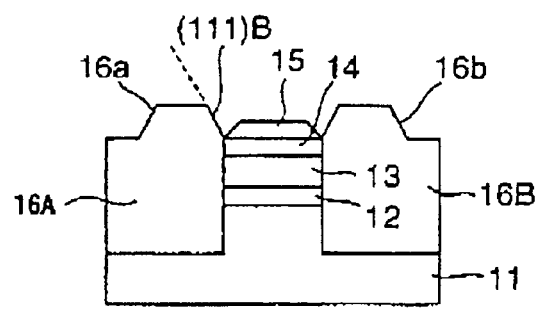
FIG. 1C is a view for explaining a manufacturing process of a laser diode having a buried hetero structure according to a related art.
Figure 1D:
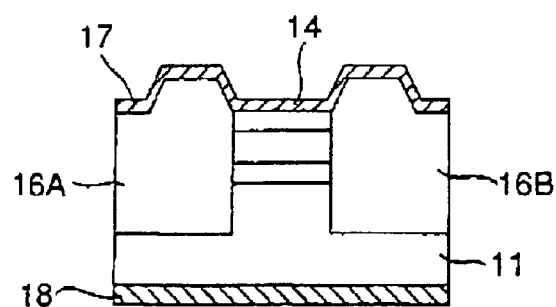
FIG. 1D is a view for explaining a manufacturing process of a laser diode having a buried hetero structure according to a related art.
Figure 2:
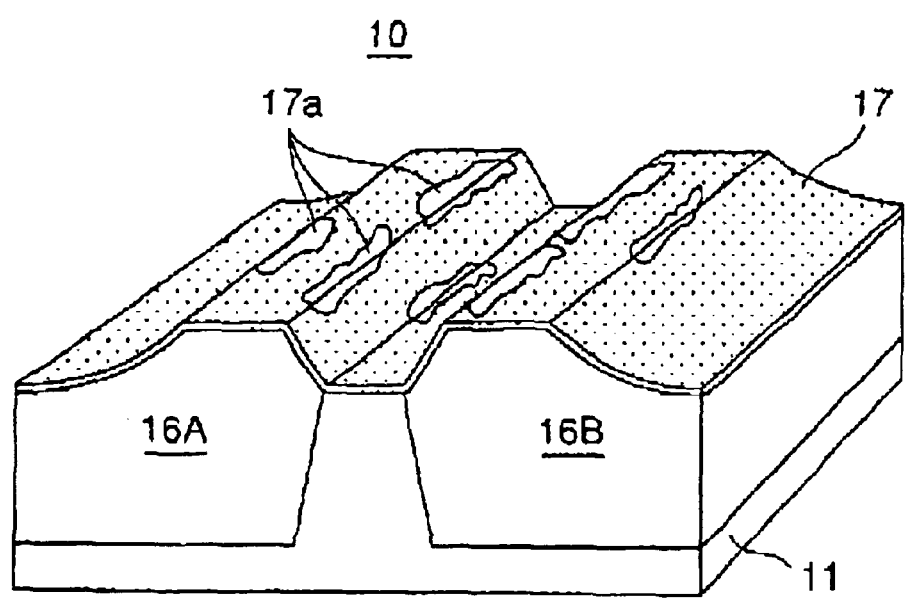
FIG. 2 is a view for explaining a problem in the process shown in FIGS. 1A to 1D.

Because the buried layers 106, and 1062 become flat surfaces in the process shown in FIG. 17E, the p-side electrode 107 is grown on a flat surface. Therefore, the breaking of the electrode as shown in FIG. 2 is not generated.

A description regarding a second embodiment of a manufacturing process of a laser diode having a BH structure according to the present invention will now be given, with reference of FIGS. 18A to 18C.

Figure 18A:
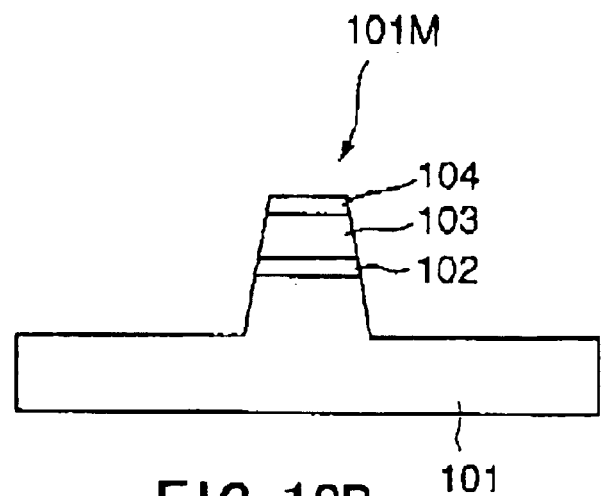
FIG. 18A is a view of a manufacturing process of a laser diode of a second embodiment according to the present invention.
Figure 18B:
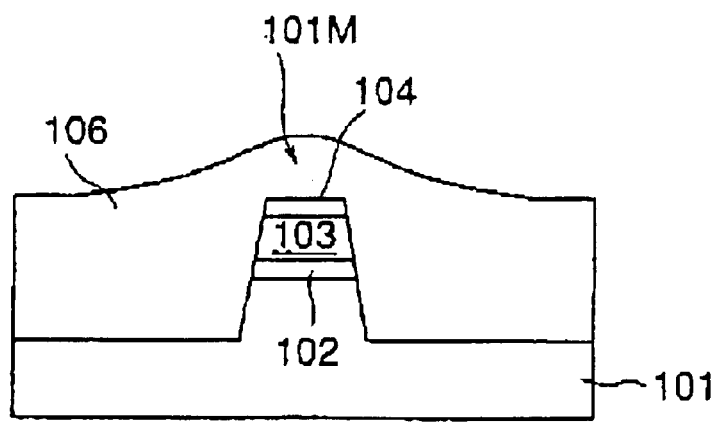
FIG. 18B is a view of a manufacturing process of a laser diode of a second embodiment according to the present invention.
Figure 18C:
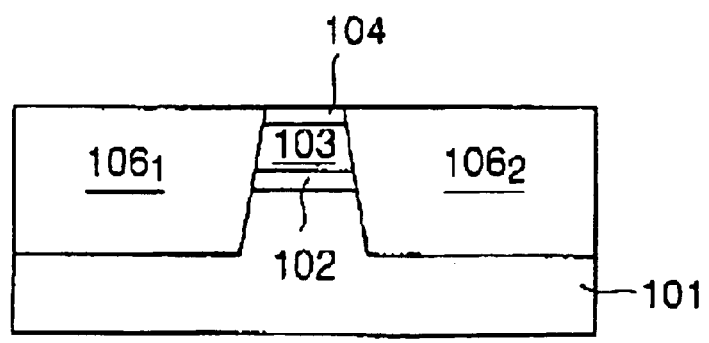
FIG. 18C is a view of a manufacturing process of a laser diode of a second embodiment according to the present invention.

In FIGS. 18A to 18C, parts that are the same as the parts shown in the FIGS. 17A to 17E are given the same reference numerals in, and explanation thereof will be omitted.

In this embodiment, in a process shown in FIG. 18A, equivalent processes to the processes shown in FIGS. 17A and 17B are implemented. As a result of this, the mesa stripe 101M is formed on the InP substrate 101 and the $SiO_2$ film 105 is removed by etching with hydrofluoric acid.

In a process shown in FIG. 18B following the process shown in FIG. 18A, a Fe doped InP buried layer 106 crystal grows by the MOVP method. The InP buried layer 106 has a slope surface and a bulged part corresponding to a configuration of the mesa stripe 101M. In the process shown in FIG. 18B, the Fe doped InP layer is formed as a part having a lowest thickness locates at a higher position than a height of the InGaAs contact layer.

In a process shown in FIG. 18C following the step shown in FIG. 18B, etching is implemented by the etchant including hydrochloric acid, acetic acid, and water. As a result of this, the slope surface of the Fe doped InP buried layer 106 is flattened, a surface similar to the (100) surface appears.

In the process shown in FIG. 18C, etching of the InP buried layer 106 is improved, and thereby the buried layers $106_1$ and $106_2$ are formed at both sides of the mesa stripe 101M. As a result of the etching, the p-type InGaAs contact layer 104 is exposed. The exposed contact layer 104 works as an etching mask layer and the flat surface (100) having a same height as the p-type InGaAs contact layer 104 appears as a main surface of the buried layers $106_1$ and $106_2$.

A description regarding a third embodiment of a manufacturing process of a laser diode having a pn buried structure according to the present invention will now be given, with reference of FIGS. 19A to 19F.

Figure 19A:
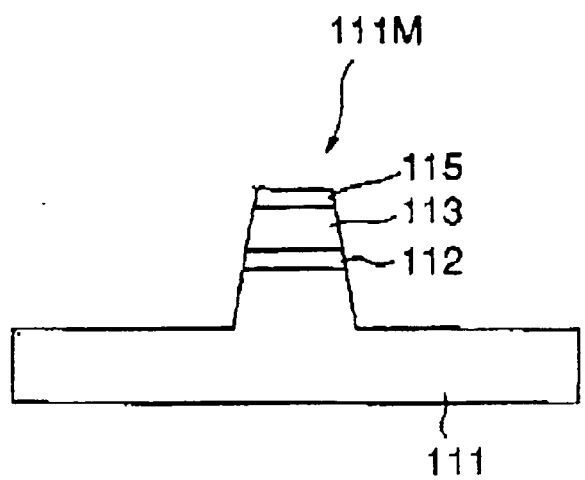
FIG. 19A is a view of a manufacturing process of a laser diode of a third embodiment according to the present invention.

Referring to FIG. 19A, an InGaAs/InGaAsP multi-quantum well active layer 112 is grown on an n-type InP substrate 111, a p-type InP clad layer 113 is grown on the InGaAs/InGaAsP multi-quantum well active layer 112, and a $SiO_2$ film 115 is grown on the p-type InP clad layer 113. An active mesa stripe 111M is formed by patterning based on dry etching.

Figure 19B:
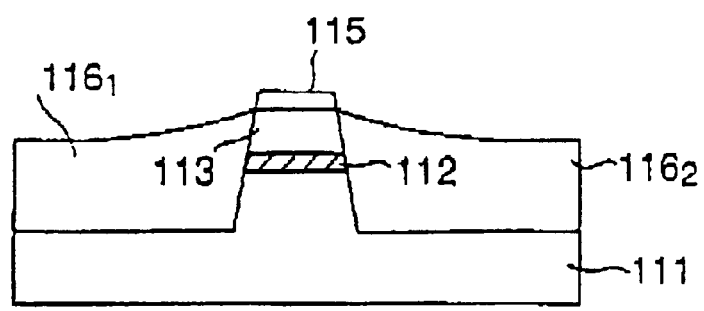
FIG. 19B is a view of a manufacturing process of a laser diode of a third embodiment according to the present invention.

In a process shown in FIG. 19B following the process shown in FIG. 19A, p-type InP layers $116_1$ and $116_2$ grow at both sides of the mesa area 111M on the InP substrate 111 by the MOVPE method, where the $SiO_2$ film 115 is used as a selective growth mask. DMZn may be used as a p doping material. The p-type InP layers $116_1$ and $116_2$ grow, as lowest parts of surfaces of the p-type hLP layers $116_1$ and $116_2$ locate at higher positions than an upper surface of the InGaAs/InGaAsP multi-quantum well active layer and lower positions than an upper surface of the p-type InP clad layer 113 in the mesa stripe 111M.

Figure 19C:
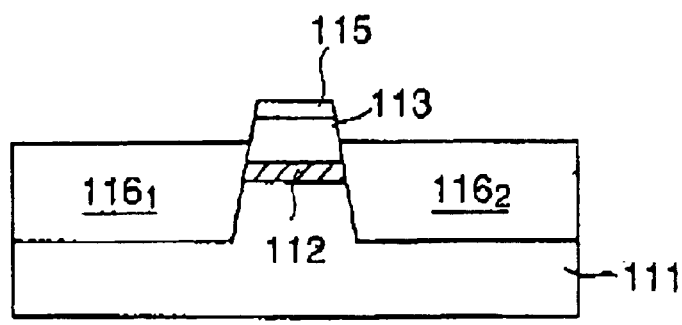
FIG. 19C is a view of a manufacturing process of a laser diode of a third embodiment according to the present invention.

In a process shown in FIG. 19C following the process shown in FIG. 19B, wet etching is implemented by the etchant including hydrochloric acid, acetic acid, and water. As a result of the wet etching, the p-type InP layers $116_1$ and $116_2$ are flattened. Thereby, surfaces of the p-type InP layers $116_1$ and $116_2$ are formed as corresponding to lowest areas of initial surfaces of the p-type InP layers $116_1$ and $116_2$. The surfaces of the p-type InP layers $116_1$ and $116_2$ are formed at higher positions than an upper surface of the InGaAs/InGaAsP multi-quantum well active layer 112 and lower positions than an upper surface of the p-type InP clad layer 113.

Figure 19D:
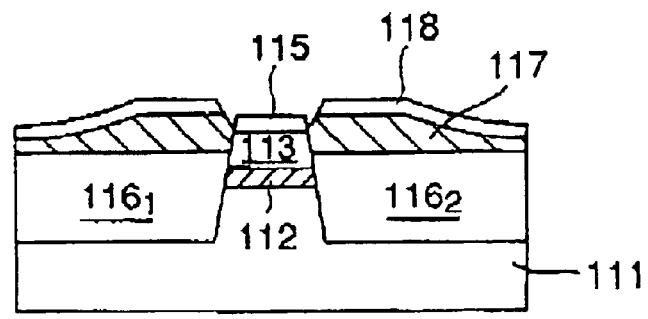
FIG. 19D is a view of a manufacturing process of a laser diode of a third embodiment according to the present invention.

In a process shown in FIG. 19D following the process shown in FIG. 19C, n-type InP layers 117 crystal grow on the p-type InP layers $116_1$ and $116_2$. P-type InP layers 118 crystal grow on the n-type InP layers 117.

Figure 19E:
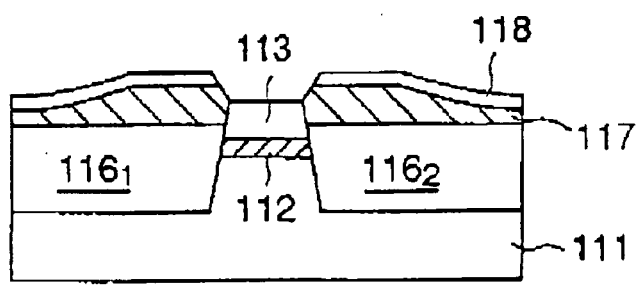
FIG. 19E is a view of a manufacturing process of a laser diode of a third embodiment according to the present invention.

In a process shown in FIG. 19E following the process shown in FIG. 19D, the $SiO_2$ film 115 is removed by etching with hydrofluoric acid.

Figure 19F:
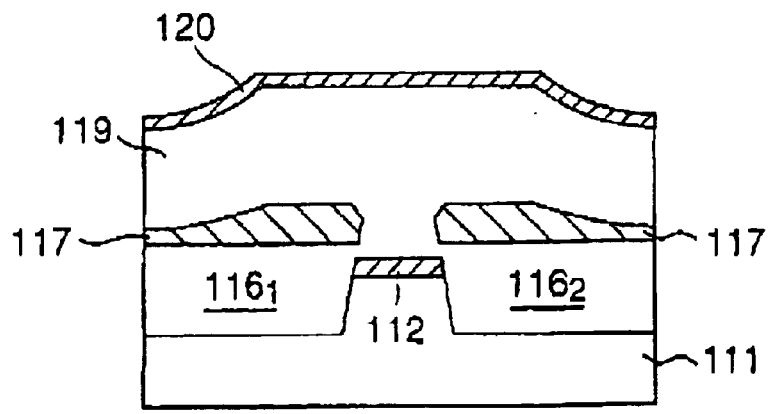
FIG. 19F is a view of a manufacturing process of a laser diode of a third embodiment according to the present invention.

In a process shown in FIG. 19F following the process shown in FIG. 19E, a p-type InP clad layer 119 and a p-type InGaAs contact layer 120 grow by the MOVPE method.

Generally, a location of the n-type InP buried layer 117 should be controlled accurately in a pn buried structure for an electric current blocking. When a distance between the n-type InP buried layer 117 and the active layer 112 is long, an electric current leak pass is formed, and thereby an efficiency of electric current injection is reduced. When the distance between then-type InP buried layer 117 and the active layer 112 is too short, there is no electric insulation between the n-type InP buried layer 117 and the n-type InP layer 111 of a lower part of the active layer, and an electric current leaks through n-type InP layer. On the other hand, according to a method of this embodiment of the present invention, a position of a lower surface of the n-type InP buried layer 117 is decided only on a basis of the initial thickness of the p-type InP layers $116_1$ and $116_2$ shown in FIG. 19B, namely, only on a basis of growth time. Therefore, the position of the lower surface of the n-type InP buried layer 117 is not influenced by an index of a surface of crystal growth generated by the MOVPE method. It is difficult for the surface of the crystal growth to control a position of the surface of the crystal growth because the surface of the crystal growth can be easily changed on growth conditions such as a growth temperature or pressure. Besides, the n-type InP buried layer 117 is not influenced by a surface direction dependency of the efficiency of n-type-dopant absorption in the InP layer because the n-type InP buried layer 117 grows on the p-type InP layers $116_1$ and $116_2$ having (100) surface. Hence, it is possible to form the n-type InP layer 117 having a constant density on whole surfaces.

A description regarding a fourth embodiment of a manufacturing process of a laser diode having a pn buried structure according to the present invention will now be given, with reference of FIGS. 20A to 20G.

Figure 20A:
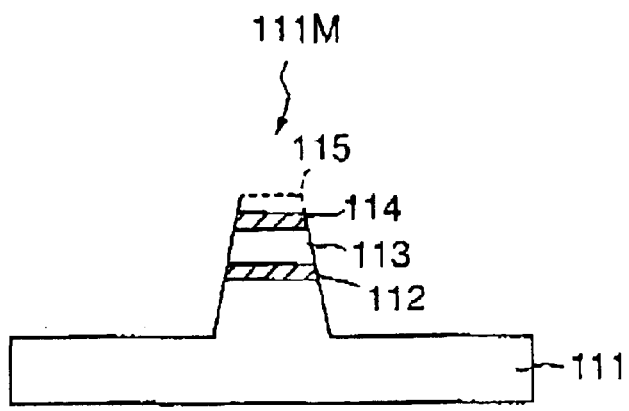
FIG. 20A is a view of a manufacturing process of a laser diode of a fourth embodiment according to the present invention.

Referring to FIG. 20A, the InGaAsP/InGaAsP multi-quantum well active layer 112 is grown on the n-type InP substrate 111, the p-type InP clad layer 113 is grown on the InGaAsP/InGaAsP multi-quantum well active layer 112, and the p-type InGaAs contact layer 114 is grown on the p-type InP clad layer 113. A mesa stripe 111M is formed on the substrate 111 by dry etching in which the $SiO_2$ film 115 is used as a mask. In the FIG. 20A, the $SiO_2$ film 115 is removed by etching with hydrofluoric acid.

Figure 20B:
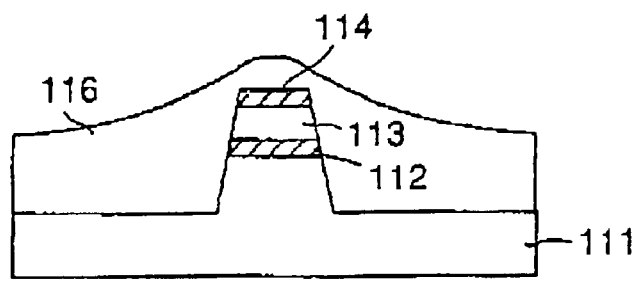
FIG. 20B is a view of a manufacturing process of a laser diode of a fourth embodiment according to the present invention.
Figure 22A:
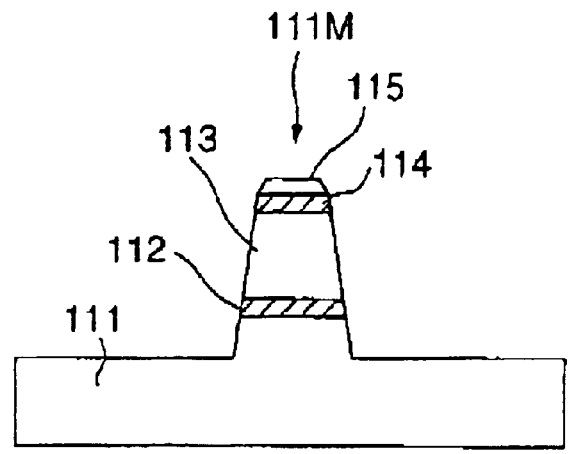
FIG. 22A is a view of a manufacturing process of a laser diode of a sixth embodiment according to the present invention.

In a process shown in FIG. 20B following the process shown in FIG. 20A, a p-type InP layer 116 crystal grows on a structure shown in FIG. 22A. In the process shown in FIG. 22B, a thickness of the p-type InP layer 116 is set as a lowest part of the surface of the p-type InP layer 116 locates at a higher position than an upper surface of the InGaAsP/InGaAsP multi-quantum well active layer 112 and at a lower position than a lower surface of a p-InGaAs contact layer 114.

Figure 20C:
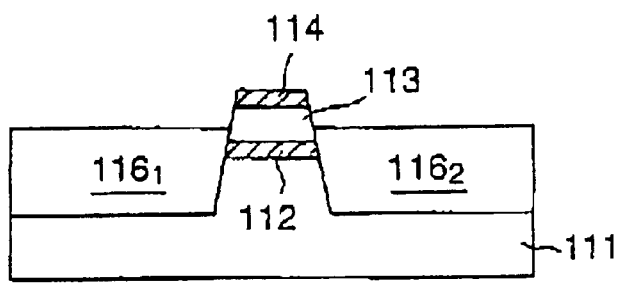
FIG. 20C is a view of a manufacturing process of a laser diode of a fourth embodiment according to the present invention.

In a process shown in FIG. 20C following the process shown in FIG. 20B, wet etching by using an etchant of a mixed liquid including hydrochloric acid, acetic acid, and water is implemented, and thereby the p-type InP layer 116 is flattened. Thereby, flat surfaces of the p-type InP layers 116 is formed as corresponding to lowest areas of initial surfaces of the p-type InP layers 116. The flat surfaces of the p-type InP layers 116 is formed at a higher position than the InGaAsP/InGaAsP multi-quantum well active layer 112 and at a lower position than the p-type InGaAs layer 114. As a result of a process of flattening shown in FIG. 22C, the InP layer 116 is divided into InP areas $116_1$ and $116_2$ by the mesa stripe as a border.

Figure 20D:
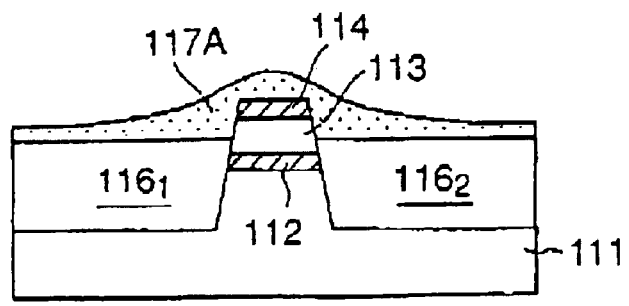
FIG. 20D is a view of a manufacturing process of a laser diode of a fourth embodiment according to the present invention.

In a process shown in FIG. 20D following the process shown in FIG. 20C, an n-type InP buried layer 117A grows on a structure shown in FIG. 20C by the MOVPE method. A thickness of the n-type InP layer 117A is decided as a lowest part of a surface of the InP layer 117A locates at a lower position than a lower surface of the InGaAs contact layer 114.

Figure 20E:
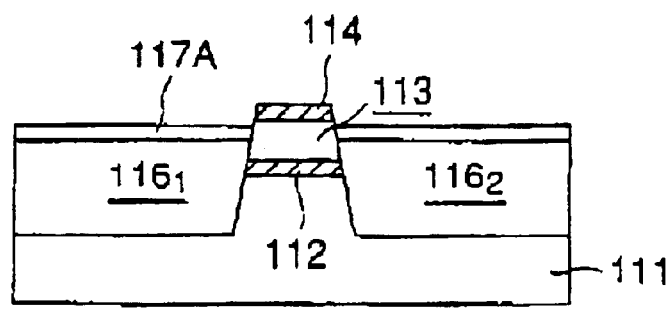
FIG. 20E is a view of a manufacturing process of a laser diode of a fourth embodiment according to the present invention.

In a process shown in FIG. 20E following the process shown in FIG. 20D, the n-type InP buried layer 117A is wet etched by the etchant including hydrochloric acid, acetic acid, and water. As a result of this, a surface of the n-typed InP layer 117A is flattened at a lower position than the InGaAs contact layer 114.

Figure 20F:
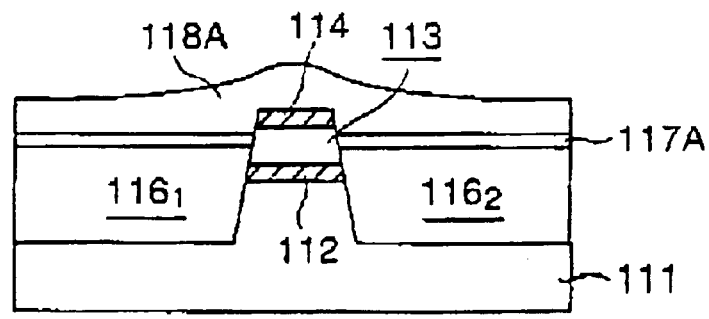
FIG. 20F is a view of a manufacturing process of a laser diode of a fourth embodiment according to the present invention.

In a process shown in FIG. 20F following the process shown in FIG. 20E, a p-type InP buried layer 118A grows as covering the InGaAs contact layer 114, by the MOVPE method.

Figure 20G:
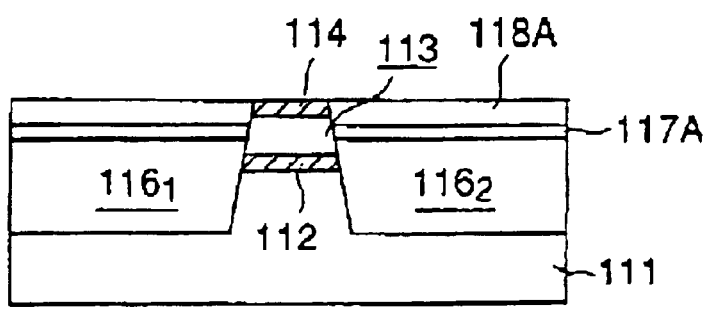
FIG. 20G is a view of a manufacturing process of a laser diode of a fourth embodiment according to the present invention.

In a process shown in FIG. 20G, the p-type InP buried layer 118A shown in FIG. 20F is wet etched by the etchant including hydrochloric acid, acetic acid, and water, and thereby a height of an upper surface of the InP buried layer 118A is the same as a height of the InGaAs contact layer 114.

According to this embodiment, the film thickness of the p-type InP buried layer 116A is controlled in the process shown in FIG. 20B. Hence, a location of the lower surface of the n-type InP buried layer 117A is controlled. Furthermore, the initial film thickness of the n-type InP buried layer 117A is controlled in the process shown in FIG. 20D. Hence, a location of the upper surface of the n-type InP buried layer 117A is controlled. Therefore, the electric current blocking structure can be manufactured accurately.

A description regarding a fifth embodiment of a manufacturing process of a laser diode having a pn buried structure according to the present invention will now be given, with reference of FIGS. 21A to 21G.

Figure 21A:
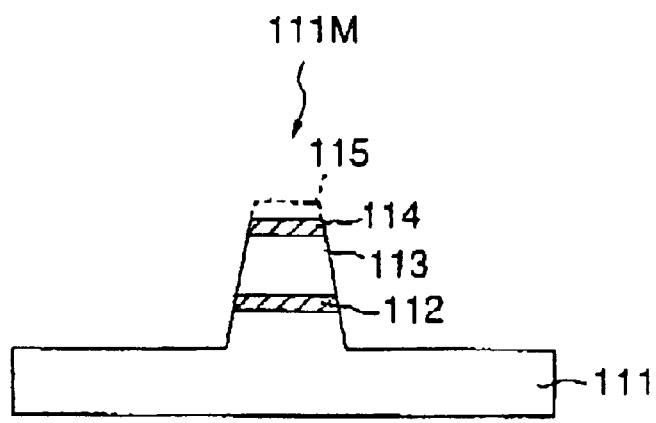
FIG. 21A is a view of a manufacturing process of a laser diode of a fifth embodiment according to the present invention.

Referring to FIG. 21A, the InGaAsP/InGaAsP multi-quantum well active layer 112 is grown on the n-type InP substrate 111, the p-type InP clad layer 113 is grown on the InGaAsP/InGaAsP multi-quantum well active layer 112, and the p-type InGaAs contact layer 114 is grown on the p-type InP clad layer 113. The mesa stripe 111M including the p-type InP clad layer 113 and the p-type InGaAs contact layer 114, is formed on the substrate 111 by dry etching in which the $SiO_2$ film 115 is used as a mask. The $SiO_2$ film 115 is removed by etching with hydrofluoric acid.

Figure 21B:
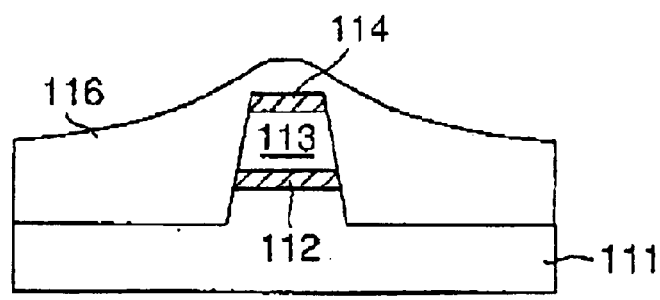
FIG. 21B is a view of a manufacturing process of a laser diode of a fifth embodiment according to the present invention.

In a process shown in FIG. 21B following the process shown in FIG. 21A, the p-type InP layer 116 crystal grows on the structure shown in FIG. 21A. In the process shown in FIG. 21B, a thickness of the p-type InP layer 116 is set as a lowest part of a surface of the p-type InP layer 116 locates at a higher position than an upper surface of the InGaAsP/InGaAsP multi-quantum well active layer 112 and at a lower position than a lower surface of the p-InGaAs contact layer 114.

Figure 21C:
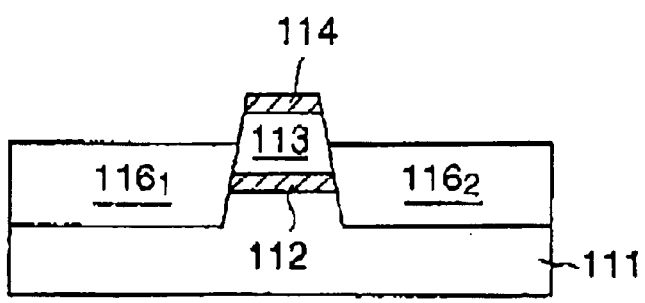
FIG. 21C is a view of a manufacturing process of a laser diode of a fifth embodiment according to the present invention.

In a process shown in FIG. 21C following the process shown in FIG. 21B, wet etching by using the etchant of the mixed liquid including hydrochloric acid, acetic acid, and water is implemented, and thereby the p-type InP layer 116 is flattened. Thereby, the flat surface of the p-type InP layers 116 is formed as corresponding to the lowest area of an initial surface of the p-type InP layers 116. The flat surface of the p-type InP layers 116 is formed at a higher position than an upper surface of the InGaAsP/InGaAsP multi-quantum well active layer 112 and at a lower position than the p-type InGaAs layer 114. As a result of a process of flattening shown in FIG. 21C, the InP layer 116 is divided into the InP areas $116_1$ and $116_2$ by the mesa stripe as a border. Thus, the processes shown in FIGS. 21A to 21C respectively correspond to the processes shown in FIGS. 20A to 20C.

Figure 21D:
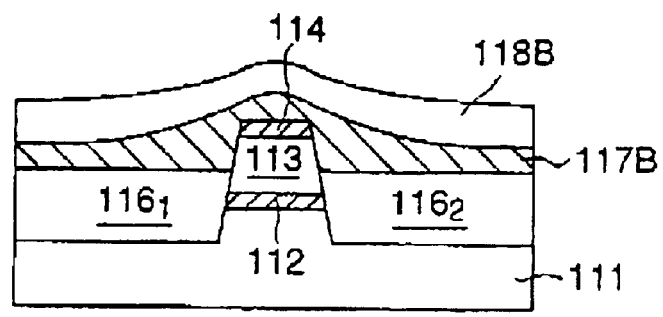
FIG. 21D is a view of a manufacturing process of a laser diode of a fifth embodiment according to the present invention.

In a process shown in FIG. 21D, an n-type InP layer 117B and a p-type InP buried layer 118B grow in turn by the MOVPE method. Thicknesses of the n-type InP layer 117B and the p-type InP buried layer 118B are set, as a lowest part of a surface of the n-type InP layer 117B locates at a lower position than a lower surface of the n-type InP layer 117B and a lowest part of a surface of the p-type InP layer 118B locates at a higher position than the InGaAs layer 114.

Figure 21E:
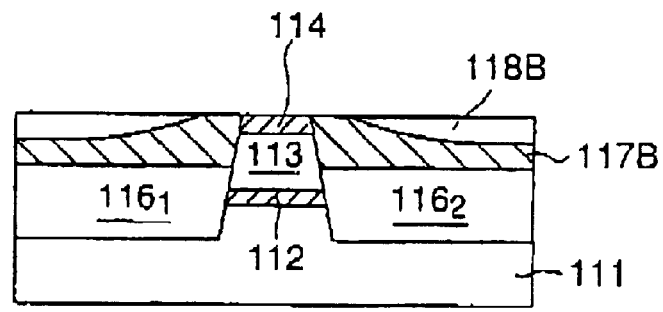
FIG. 21E is a view of a manufacturing process of a laser diode of a fifth embodiment according to the present invention.

In a process shown in FIG. 21E following the process shown in FIG. 21D, the n-type InP layer 117B and the p-type InP buried layer 118B are wet etched by the etchant of the mixed liquid including hydrochloric acid, acetic acid, and water. In the process of the wet etching, surfaces of the n-type InP layer 117B and the p-type InP buried layer 118B are flattened by using the InGaAs layer 114 as an etching mask.

Figure 21F:
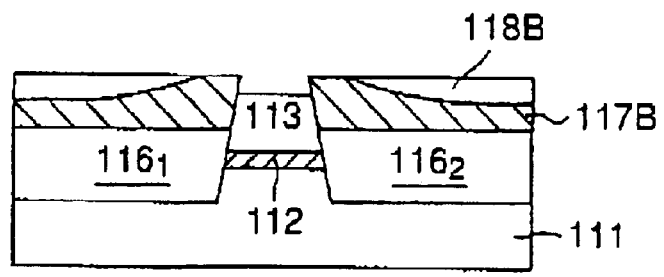
FIG. 21F is a view of a manufacturing process of a laser diode of a fifth embodiment according to the present invention.
Figure 21G:
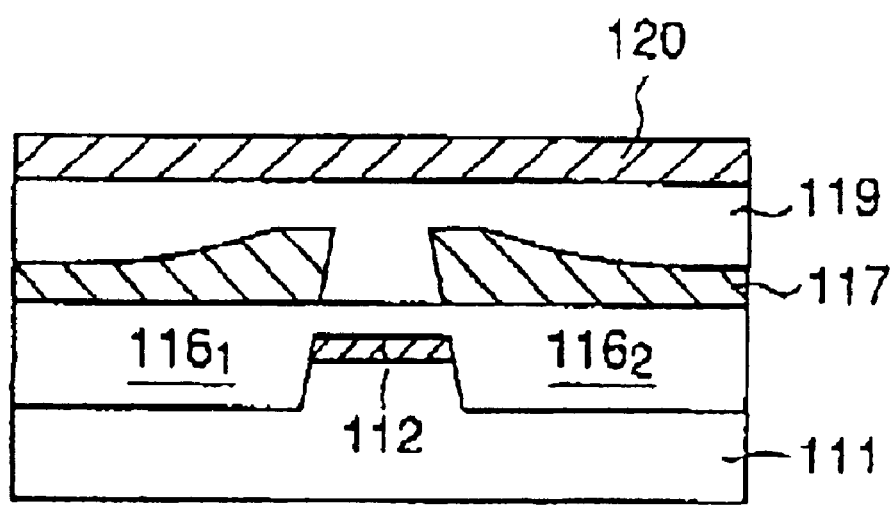
FIG. 21G is a view of a manufacturing process of a laser diode of a fifth embodiment according to the present invention.

In a process shown in FIG. 21F following the process shown in FIG. 21E, the InGaAs layer 114 is removed by etching with the mixed liquid including hydrofluoric acid and nitric acid. In a process shown in FIG. 21G, a p-type InP clad layer 119 and a p-type InGaAs contact layer 120 crystal grow in turn by the MOVPE method.

In the process shown in FIG. 21B, a position of a lower surface of the n-type InP buried layer 117 can be controlled by controlling a thickness of the n-type InP buried layer 116.

A description regarding a sixth embodiment of a manufacturing process of a laser diode having a pn buried structure according to the present invention will now be given, with reference of FIGS. 22A to 22D. In FIGS. 22A to 22D, parts that are the same as the parts described above are given the same reference numerals in, and explanation thereof will be omitted.

Referring to FIG. 22A, the InGaAsP/InGaAsP multi-quantum well active layer 112 is grown on the n-type InP substrate 111, the p-type InP clad layer 113 is grown on the InGaAsP/InGaAsP multi-quantum well active layer 112, and the p-type InGaAs contact layer 114 is grown on the p-type InP clad layer 113. The mesa stripe 111M is formed on the substrate 111 by dry etching in which the SiO$_2$ film 15 is used as a mask.

Figure 22B:
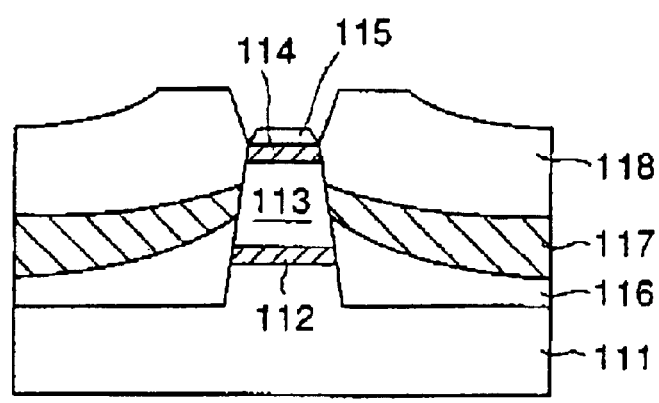
FIG. 22B is a view of a manufacturing process of a laser diode of a sixth embodiment according to the present invention.

In a process shown in FIG. 22B following the process shown in FIG. 22A, the p-type InP buried layer 116, the n-type InP buried layer 117, and the p-type InP layer 118 grow in turn by the MOVPE method, in a state where the SiO$_2$ film 115 is formed on the mesa stripe 111M. The MOVPE process shown in FIG. 22B is implemented in a state of a growth temperature of 550, and a growth pressure of 0.1 atmospheres, by using a material in a III group, a material in a V group, TMIn, PH$_3$, DMZn, and SiH$_4$ as p-type and n-type-dopant materials and adding 10 CCM of CH$_3$Cl. With a combination of such low temperature growth and adding of a gas of a chlorine group, each buried layer is controlled to bulge-grow and rather grows from a mesa bottom surface in the <100>-direction.

In a process shown in FIG. 22B, thickness of the p-type InP layer 116 and the n-type InP layer 117 are set as a contact position between a lower surface of the n-type InP layer 117 and the mesa stripe 111M locates at a higher position than an upper surface of the active layer 112, and a contact position between an upper surface of the n-type InP layer 117 and the mesa stripe 111M locates at a lower position than a lower surface of the p-type InGaAs contact layer 114.

Figure 22C:
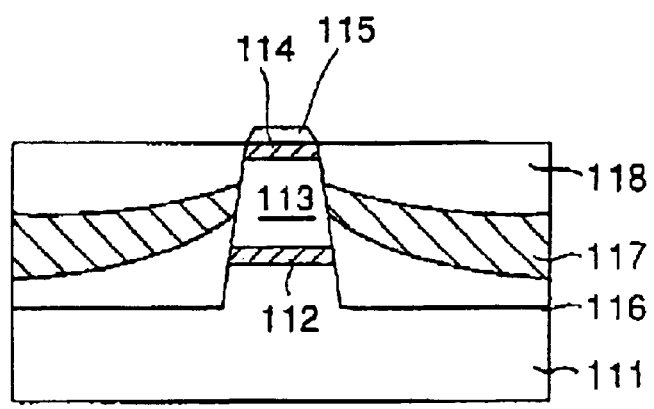
FIG. 22C is a view of a manufacturing process of a laser diode of a sixth embodiment according to the present invention.

In a process shown in FIG. 22C following the process shown in FIG. 22B, wet etching is implemented by using the etchant of the mixed liquid including hydrochloric acid, acetic acid, and water and using the SiO$_2$ film 115 as a mask. As a result of this, the p-typed InP layer 118 is flattened, and thereby a flat surface corresponding to an upper surface of the InGaAs clad layer 114 is obtained.

Figure 22D:
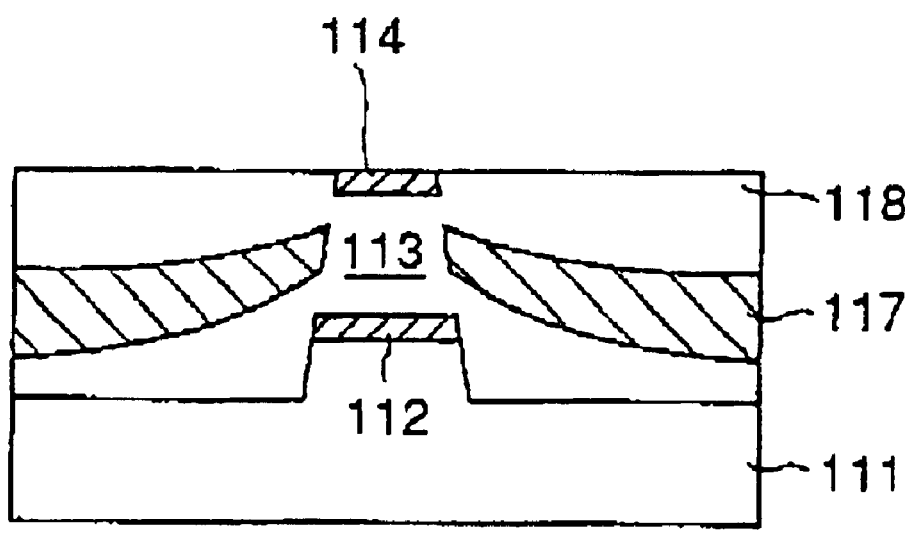
FIG. 22D is a view of a manufacturing process of a laser diode of a sixth embodiment according to the present invention.

In a process shown in FIG. 22D, the SiO$_2$ film 115 is removed by etching with a mixed liquid including hydrofluoric acid and hydrogen peroxide water.

In this embodiment, it is possible to obtain a flat growth surface with buried growth of one time, and thereby it is possible to greatly simplify the manufacturing process of the laser diode.

A description regarding a seventh embodiment of a manufacturing process of a laser diode having a ridge structure according to the present invention will now be given, with reference of FIGS. 23A to 23E.

Figure 23A:
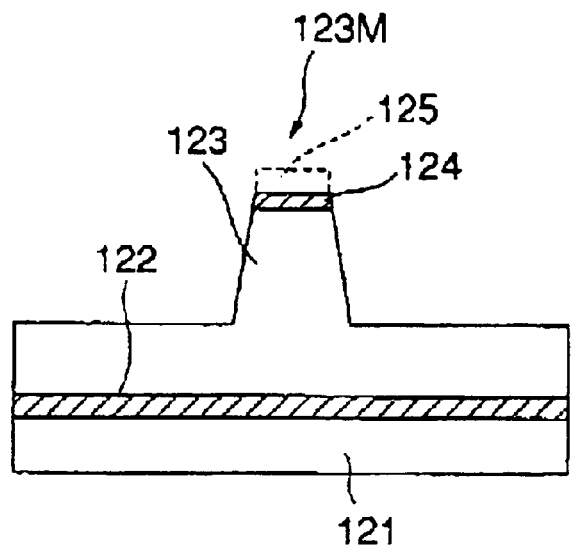
FIG. 23A is a view of a manufacturing process of a laser diode of a seventh embodiment according to the present invention.

Referring to FIG. 23A, an InGaAs/InGaAsP multi-quantum well active layer 122 is grown on an n-type InP substrate 121, a p-type InP clad layer 123 is grown on the InGaAs/InGaAsP multi-quantum well active layer 122, and a p-type InGaAs contact layer 124 is grown on the p-type InP clad layer 123. A ridge stripe 123M is formed on the clad layer 123 by patterning on a basis of dry etching in which a SiO$_2$ film 125 is used as a mask. Furthermore, in the process shown in FIG. 23A, the SiO$_2$ film 125 is removed by etching with hydrofluoric acid.

Figure 23B:
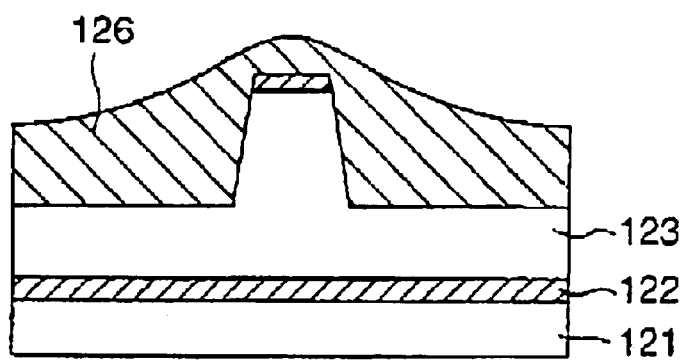
FIG. 23B is a view of a manufacturing process of a laser diode of a seventh embodiment according to the present invention.

In a process shown in FIG. 23B following the process shown in FIG. 23A, the n-type InP layer 126 crystal grows. At that time, a thickness of the n-type InP layer 126 is set as an upper surface of the n-type InP layer 126 locates at a lower position than a lower surface of the p-type InGaAs layer 124.

Figure 23C:
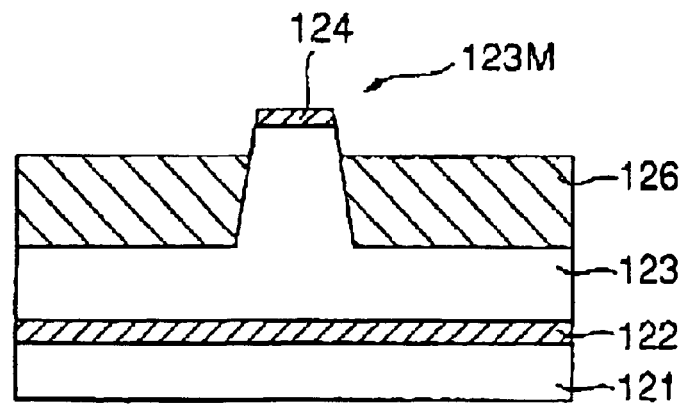
FIG. 23C is a view of a manufacturing process of a laser diode of a seventh embodiment according to the present invention.

In a process shown in FIG. 23C following the process shown in FIG. 23B, wet etching is implemented by the etchant of the mixed liquid including hydrochloric acid, acetic acid, and water and with the InGaAs contact layer 124 as a mask. As a result of this, a surface of the n-type InP layer 126 is flattened, and thereby a position of an upper surface of the n-type InP layer 126 locates at a lower position than a position of a lower surface of the p-type InGaAs layer 124.

Figure 23D:
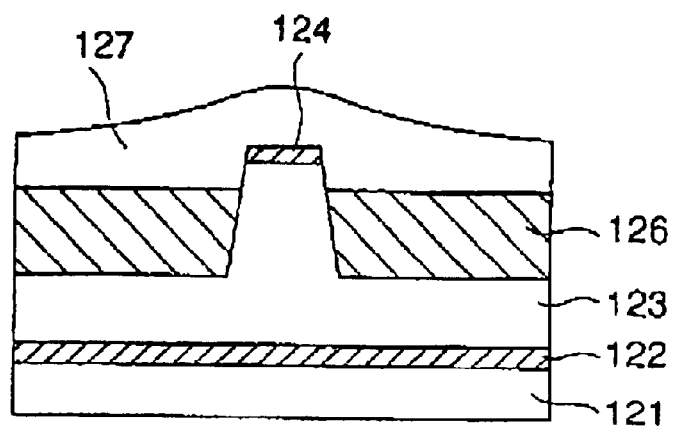
FIG. 23D is a view of a manufacturing process of a laser diode of a seventh embodiment according to the present invention.

In a process shown in FIG. 23D following the process shown in FIG. 23C, a p-type InP layer 127 is formed by the MOVPE method. The p-type InP layer 127 has a thickness as a lowest area of an upper surface of the p-type InP layer 127 is higher than an upper surface of the p-type InGaAs layer 124.

Figure 23E:
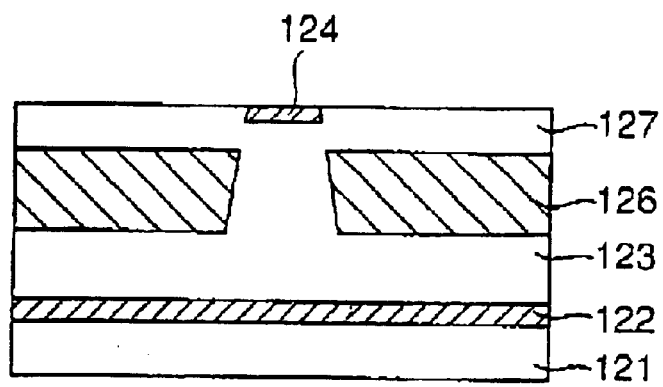
FIG. 23E is a view of a manufacturing process of a laser diode of a seventh embodiment according to the present invention.

In a process shown in FIG. 23E following the process shown in FIG. 23D, wet etching is implemented by the etchant including hydrochloric acid, acetic acid, and water and with the InGaAs contact layer 124 as a mask. And thereby the InP layer 127 is flattened. As a result of this, the p-type InP layer 127 has a surface corresponding to the surface of the InGaAs contact layer 124.

It is necessary that a surface position of the n-type InP buried layer 126 is controlled carefully in order to realize an effective electric current blocking for a laser diode having the ridge structure. For instance, if a distance between the n-type IIP layer 126 and p-type InGaAs contact layer 124 is long, the distance acts as an electric leak pass. In a method of this embodiment, a designated and effective electric current blocking is realized by only controlling a thickness of the n-type InP buried layer 126 in the process shown in FIG. 23B.

A description regarding a eighth embodiment of a manufacturing process of a laser diode having a ridge structure according to the present invention will now be given, with reference of FIGS. 24A to 24F. In FIGS. 24A to 24F, parts that are the same as the parts described above are given the same reference numerals in, and explanation thereof will be omitted.

Figure 24A:
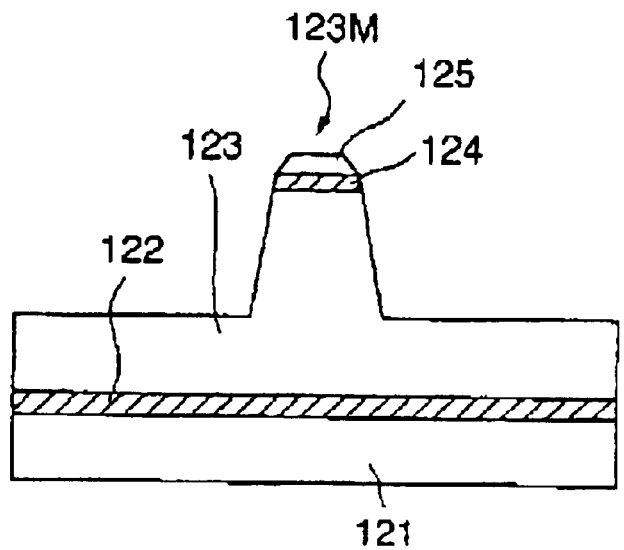
FIG. 24A is a view of a manufacturing process of a laser diode of a eighth embodiment according to the present invention.

Referring to FIG. 24A, the InGaAs/InGaAsP multi-quantum well active layer 122 is grown on the n-type InP substrate 121, the p-type InP clad layer 123 is grown on the InGaAs/InGaAsP multi-quantum well active layer 122, and the p-type InGaAs contact layer 124 is grown on the p-type InP clad layer 123. The ridge stripe 123M is formed on the clad layer 123 by dry etching in which the SiO$_2$ film 125 is used as a mask.

Figure 24B:
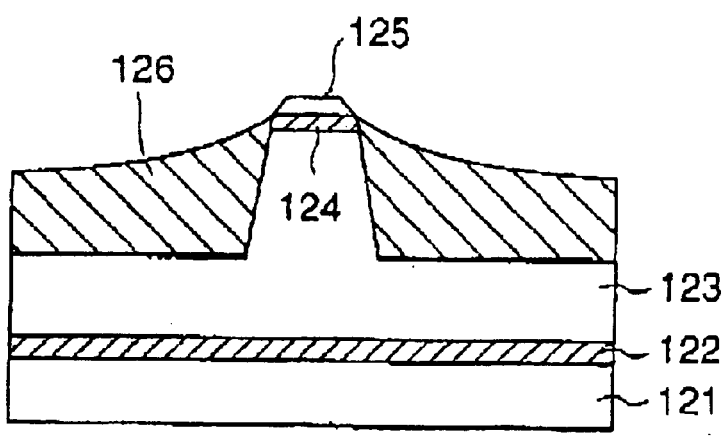
FIG. 24B is a view of a manufacturing process of a laser diode of a eighth embodiment according to the present invention.

In a process shown in FIG. 24B following the process shown in FIG. 24A, the n-type InP layer 126 is formed by the MOVPE method in a state where the SiO$_2$ film 125 remains as a selective growth mask. The n-type InP layer 126 has a thickness as an upper surface of the n-type InP layer 126 is lower than a lower surface of the p-type InGaAs contact layer 124.

Figure 24C:
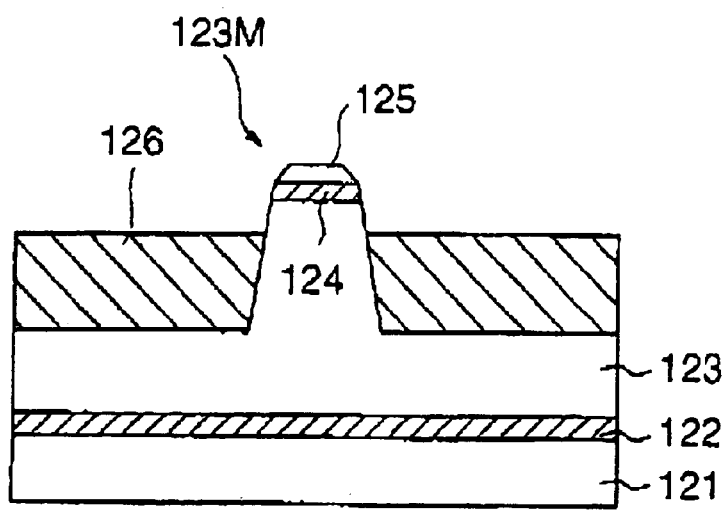
FIG. 24C is a view of a manufacturing process of a laser diode of a eighth embodiment according to the present invention.

In a process shown in FIG. 24C following the process shown in FIG. 24B, wet etching, is implemented by the etchant including hydrochloric acid, acetic acid, and water and thereby the n-type InP layer 126 has a flat surface as the flat surface locates at a lower position than the p-type InGaAs layer 124.

Figure 24D:
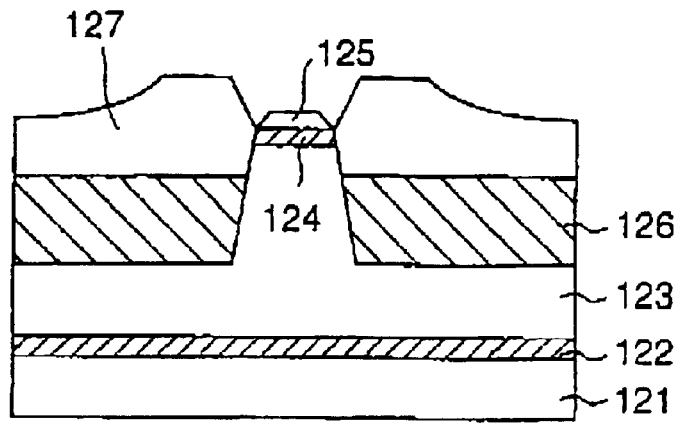
FIG. 24D is a view of a manufacturing process of a laser diode of a eighth embodiment according to the present invention.

In a process shown in FIG. 24D following the process shown in FIG. 24C, the p-type InP layer 127 is formed by the MOVPE method in a state the SiO$_2$ film 125 remains as a selective growth mask. The p-type InP layer 127 has a thickness as a lowest area of the upper surface of the p-type InP layer 127 is higher than a height of the p-type InGaAs layer 124.

Figure 24E:
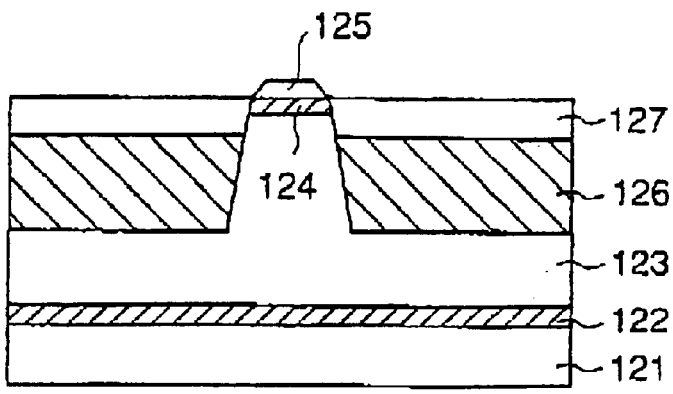
FIG. 24E is a view of a manufacturing process of a laser diode of a eighth embodiment according to the present invention.

In a process shown in FIG. 24E following the process shown in FIG. 24D, wet etching is implemented by the etchant including hydrochloric acid, acetic acid, and water, and thereby the p-type InP layer 127 is flattened. A flattening process shown in FIG. 24E is implemented in a state where the SiO$_2$ film 125 remains on the contact layer 124. As a result of this, a height of a flat surface of the p-type InP layer 127 corresponds to the height of an upper surface of the contact layer 124.

Figure 24F:
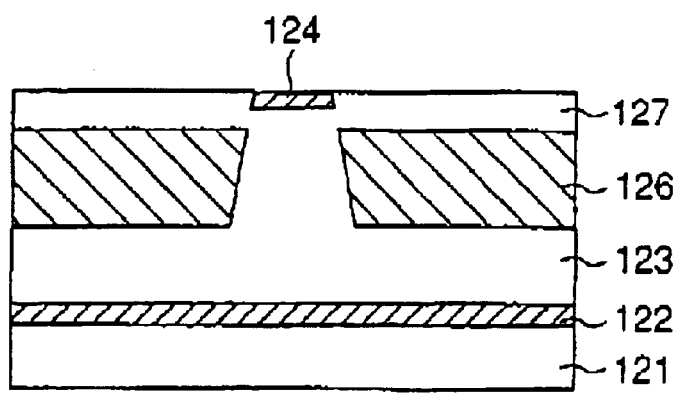
FIG. 24F is a view of a manufacturing process of a laser diode of a eighth embodiment according to the present invention.

In a process shown in FIG. 24F following the process shown in FIG. 24E, the SiO$_2$ film 125 is removed by etching with the etchant of the mixed liquid including hydrofluoric acid and a hydrogen peroxide water.

A description regarding a ninth embodiment of a manufacturing process of an optical wave guide having a branch according to the present invention will now be given, with reference of FIGS. 25A to 25E.

Figure 25A:
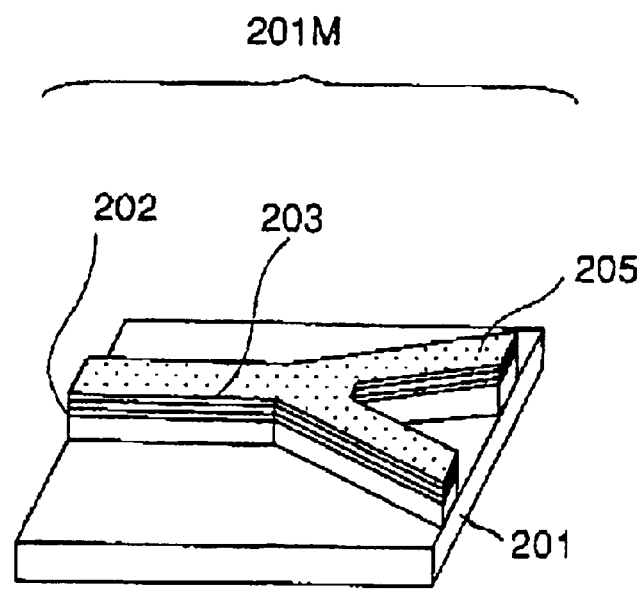
FIG. 25A is a view of a manufacturing process of an optical wave guide of a ninth embodiment according to the present invention.

Referring to FIG. 25A, an InGaAsP/InGaAsP multi-quantum well active layer 202 is grown on an n-type InP substrate 201, and an InP clad layer 203 is grown on the InGaAsP/InGaAsP multi-quantum well active layer 202. Dry etching is implemented with an $SiO_2$ pattern 205 having a branch of a Y shape, and thereby an effect of the dry etching reaches the InP substrate 201. As a result of this, a mesa stripe 201M having a Y shape corresponding to the $SiO_2$ pattern 205 is formed on the substrate 201.

Figure 25B:
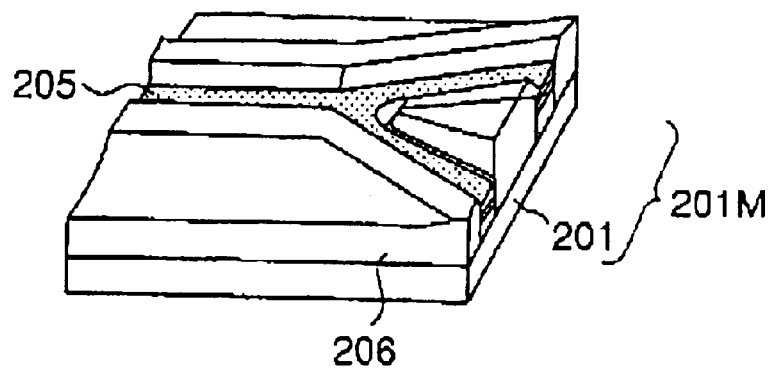
FIG. 25B is a view of a manufacturing process of an optical wave guide of a ninth embodiment according to the present invention.

In a process shown in FIG. 25B following the process shown in FIG. 25A, a Fe doped InP buried layer 206 is formed by the MOVPE method in a state where the $SiO_2$ pattern 205 remains as a selective growth mask. The Fe doped InP buried layer 206 has a thickness as the lowest part of the Fe doped InP layer 206 is higher than the upper surface of the clad layer 203 of the mesa stripe 201M. As a result of the process shown in FIG. 25B, the Fe doped InP buried layer 206 is formed on the InP substrate 201 as the mesa stripe 201M having a Y shape is clamped at a side of mesa stripe 201M.

Figure 25C:
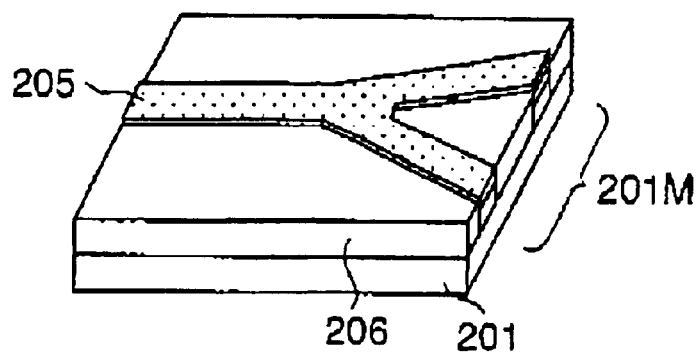
FIG. 25C is a view of a manufacturing process of an optical wave guide of a ninth embodiment according to the present invention.

In a process shown in FIG. 25C, wet etching is implemented by the etchant of mixed liquid including hydrochloric acid, acetic acid, and water. As a result of this, a surface of the Fe doped InP buried layer 206 is flattened as the surface corresponds to an upper surface of the InP clad layer 203 of the highest part of the mesa stripe 210M.

Figure 25D:
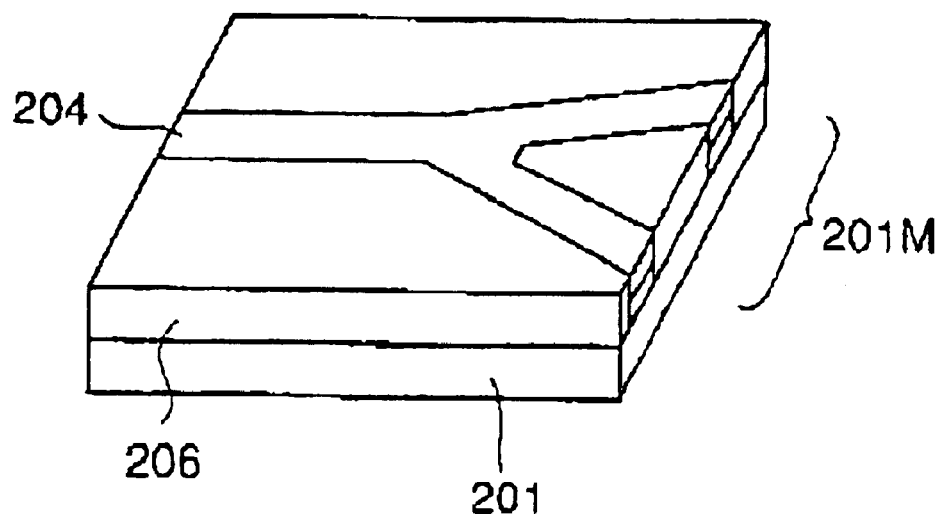
FIG. 25D is a view of a manufacturing process of an optical wave guide of a ninth embodiment according to the present invention.
Figure 25E:
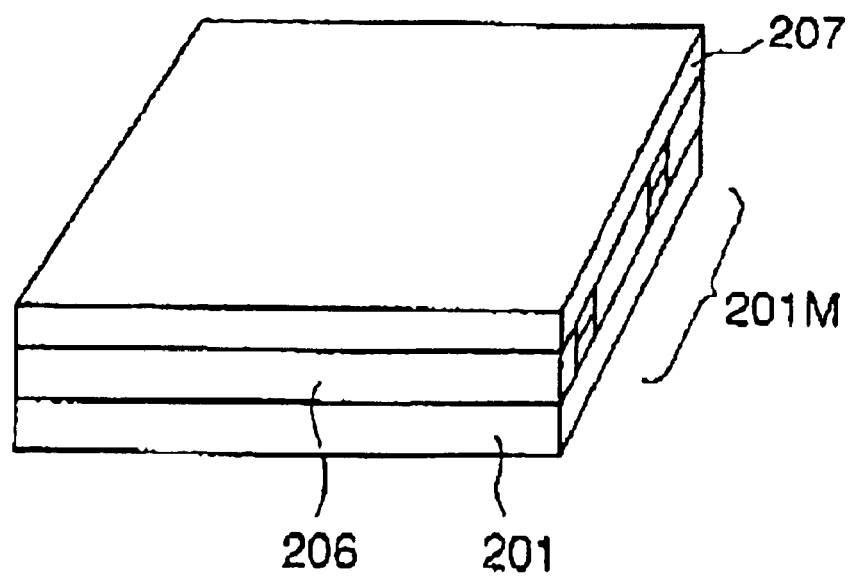
FIG. 25E is a view of a manufacturing process of an optical wave guide of a ninth embodiment according to the present invention.

In a process shown in FIG. 25D, the $SiO_2$ pattern 205 is removed by etching with a mixed liquid including hydrofluoric acid and a hydrogen peroxide water. In a process shown in FIG. 25E, the Fe doped InP layer 207 grows by the MOVPE method. At that time, a surface of the Fe doped InP layer 207 is flattened because the Fe doped InP buried layer 206 and the InP clad layer 203 make a flat surface made of (100) surface.

Figure 3:
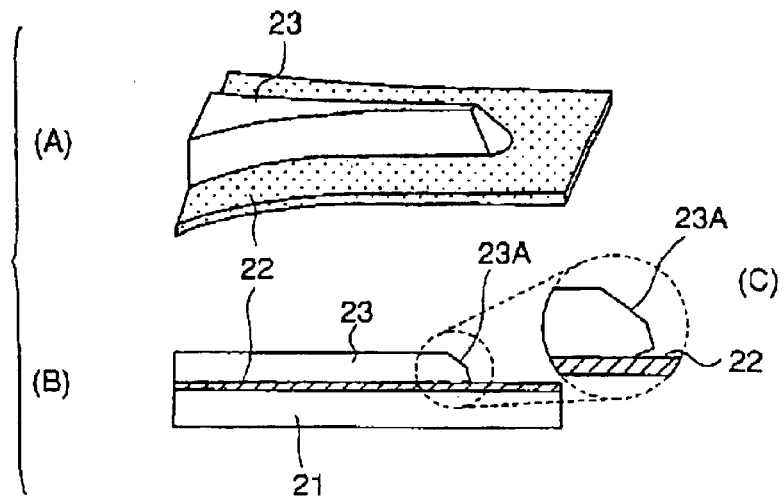
FIG. 3-(A) is a view for explaining a manufacturing process of an optical wave guide.
Figure 4:
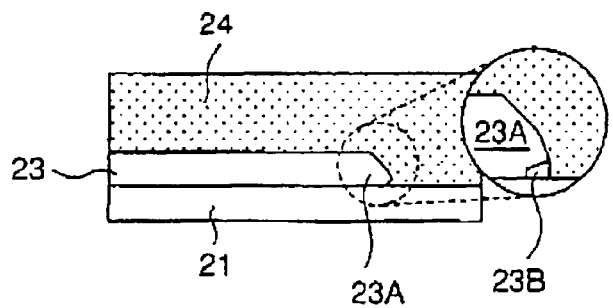
FIG. 4 is a view for explaining a problem in the process shown in FIG. 3.
Figure 5A:
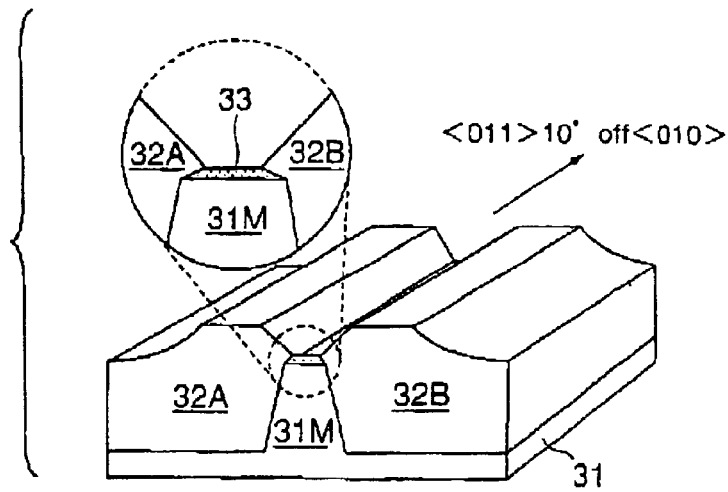
FIG. 5A is a view for explaining a manufacturing process of a laser diode and a problem in the process according to another related art.
Figure 5B:
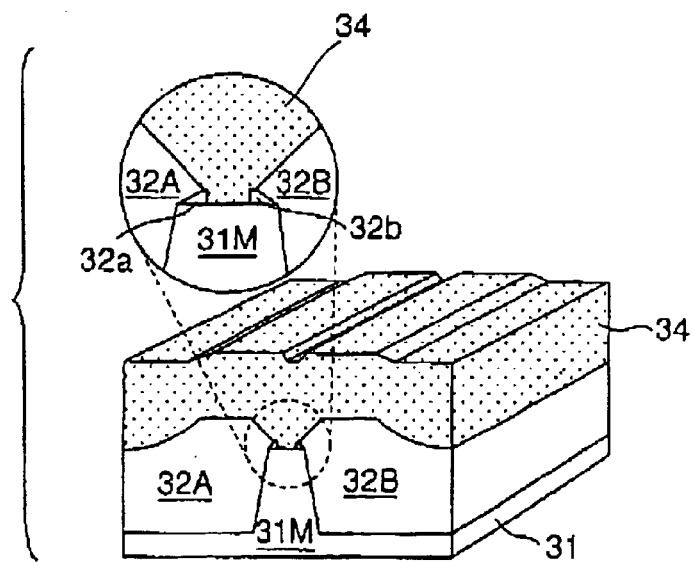
FIG. 5B is a view for explaining a manufacturing process of a laser diode and a problem in the process according to another related art.

As described with FIG. 3, according to the conventional process, the buried InP layer may overhang to the mask at a part of the branch when the InP buried layer grows around the stripe having the branch. On the other hand, according to this embodiment of the present invention, the overhung part can be removed by wet etching of the InP buried layer 206 in the process shown in FIG. 25C. As a result of this, in the process shown in FIG. 25E, even if the InP layer 207 is grown, a cave is not generated.

Figure 26A:
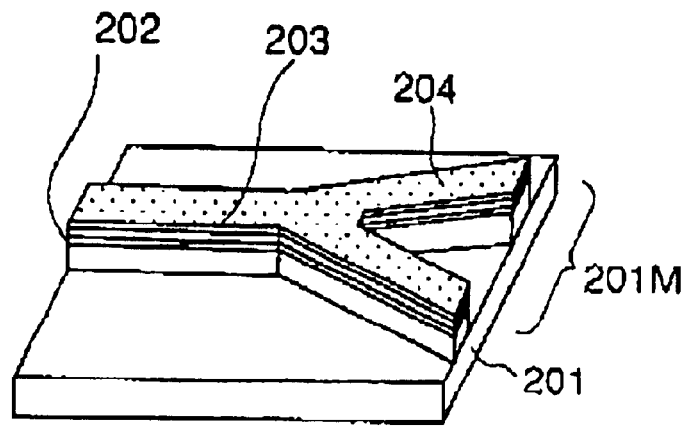
FIG. 26A is a view of a manufacturing process of an optical wave guide of a tenth embodiment according to the present invention.
Figure 26B:
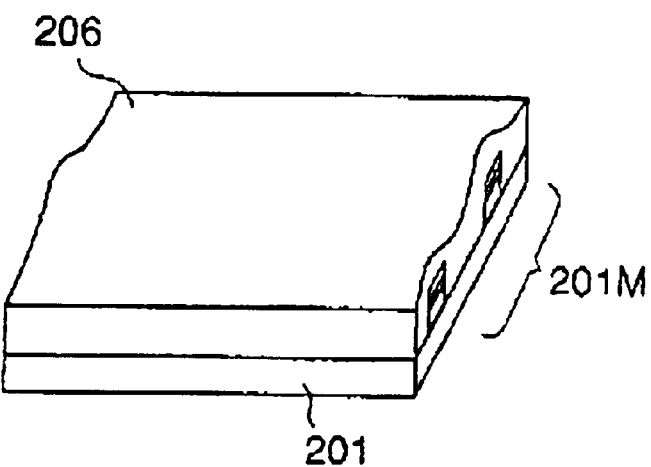
FIG. 26B is a view of a manufacturing process of an optical wave guide of a tenth embodiment according to the present invention.
Figure 26C:
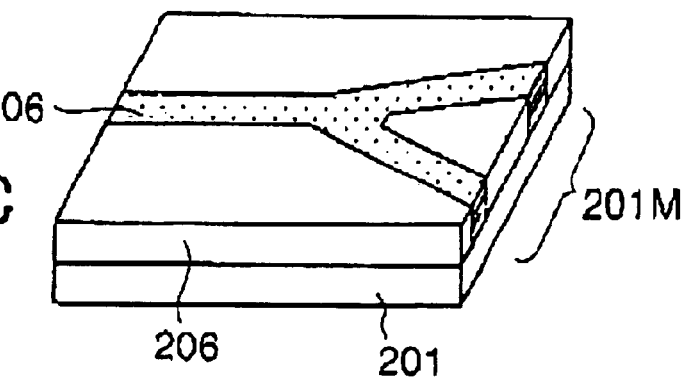
FIG. 26C is a view of a manufacturing process of an optical wave guide of a tenth embodiment according to the present invention.

A description regarding a tenth embodiment of a manufacturing process of an optical wave guide having a BH buried structure and a branch according to the present invention will now be given, with reference of FIGS. 26A to 26C. In FIGS. 26A to 26C, parts that are the same as the parts described above are given the same reference numerals in, and explanation thereof will be omitted.

Referring to FIG. 26A, an InGaAsP/InGaAsP multi-quantum well active layer 202 is grown on an n-type InP substrate 201, an InP clad layer 203 is grown on the InGaAsP/InGaAsP multi-quantum well active layer 202, and an InGaAs layer 204 is grown on the InP clad layer 203. Dry etching is implemented with an $SiO_2$ pattern 205, and thereby a mesa stripe 201M having Y shape is formed. In the process shown in FIG. 26A, after the mesa stripe is formed, the $SiO_2$ pattern 205 is removed by etching with hydrofluoric acid.

In a process shown in FIG. 26B following the process shown in FIG. 26A, a Fe doped InP buried layer 206 is formed by the MOVPE method. The Fe doped InP buried layer 206 is formed as the lowest surface of the Fe doped InP layer 206 is higher than the upper surface of the p-type InGaAs layer 204. As a result of the process shown in FIG. 26B, the Fe doped InP buried layer 206 has a concave and convex part corresponding to a stripe pattern 201M having a Y shape as a base, on a surface of the Fe doped InP buried layer 206.

In a process shown in FIG. 26C, wet etching is implemented by the etchant of mixed liquid including hydrochloric acid, acetic acid, and water. As a result of this, the InP buried layer 206 is flattened.

In the process of flattening shown in FIG. 26C, the p-type InGaAs layer 204 acts as an etching mask. As a result of this, the Fe doped InP layer 206 has a surface which substantially corresponds to a surface of the InGaAs layer 204. Therefore, in a process following to the process shown in FIG. 26C, when another semiconductor layer or an electrode pattern is formed, a problem is not generated because it is formed on a flat surface.

A description regarding an eleventh embodiment of a manufacturing process of a semiconductor device including a process of selective growth of an active layer according to the present invention will now be given, with reference of FIGS. 27A to 27C.

Figure 27A:
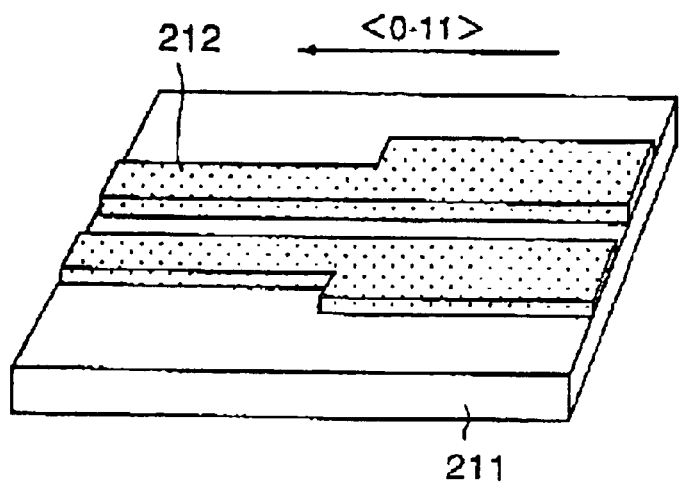
FIG. 27A is a view of a manufacturing process of a semiconductor device of an eleventh embodiment according to the present invention.

Referring to FIG. 27A, a $SiO_2$ pattern 212 is formed as a width of the $SiO_2$ pattern 212 varies along a <0-11>-direction. The $SiO_2$ pattern 212 exposes a substrate area which extends in the <0-11>-direction on a surface of the n-type InP substrate 211.

Figure 27B:
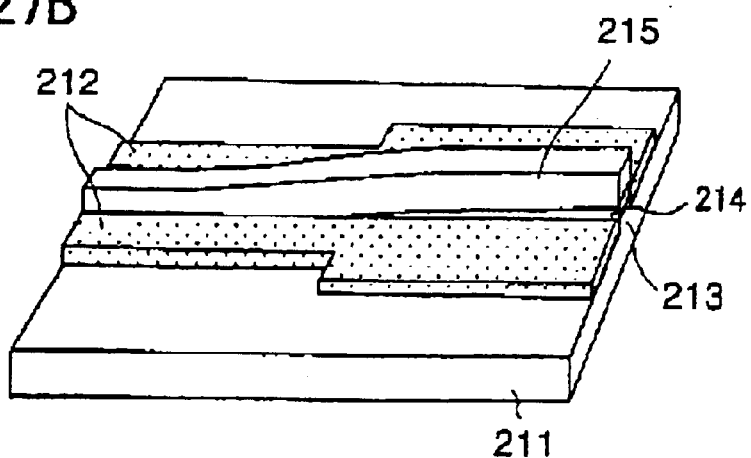
FIG. 27B is a view of a manufacturing process of a semiconductor device of an eleventh embodiment according to the present invention.

In a process shown in FIG. 27B following the process shown in FIG. 27A, the MOVPE method is implemented by using the $SiO_2$ film as a mask. And thereby, an n-type InP layer 213 is grown on the InP substrate 211, an InGaAsP/InGaAsP multi-quantum well active layer 214 is grown on the n-type InP layer 213, and a p-type In clad layer 215 is grown on the InGaAsP/InGaAsP multi-quantum well active layer 214. In the selective growth in which the $SiO_2$ pattern 212 is a mask, a material density increases on the $SiO_2$ pattern 212 where the semiconductor layer does not grow. As a result of this, a material is supplied excessively in the substrate area which extends in the <0-11>-direction where the $SiO_2$ pattern 212 is broken. Such excessive supply of the material depends on a ratio of covering of the $SiO_2$ film, namely a width of the S102 pattern 212. Hence, as the width becomes wide, an amount of an excessive supply of a material increases and the thickness of the semiconductor layers 213 to 215 increases. Since the width of the $SiO_2$ pattern 212 varies along the <0-11>-direction, the thickness of the semiconductor layers 213 to 215 varies to the <0-11>-direction.

Figure 27C:
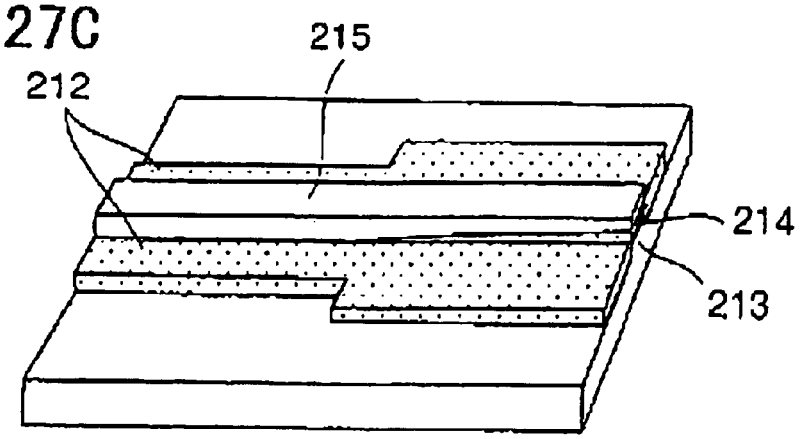
FIG. 27C is a view of a manufacturing process of a semiconductor device of an eleventh embodiment according to the present invention.

In a process shown in FIG. 27C, wet etching is implemented by the etchant of mixed liquid including hydrochloric acid, acetic acid, and water, and thereby the p-type InP layer 215 is flattened at a height corresponding to the lowest surface part of the upper surface of the p-type InP layer 215.

When a concave structure is generated in the selective growth including such the active layer 214, a problem is generated in an electric current blocking buried growth process or an electrode forming process. However, according to this embodiment, it is possible to flatten such the concave structure, and thereby the above-mentioned problem can be avoided.

A description regarding a twelfth embodiment of a manufacturing process of a semiconductor device including a selective growth process of an active layer will now be given, with reference of FIGS. 28A to 28E. In FIGS. 28A to 28E, parts that are the same as the parts described above are given the same reference numerals in, and explanation thereof will be omitted.

Figure 28A:
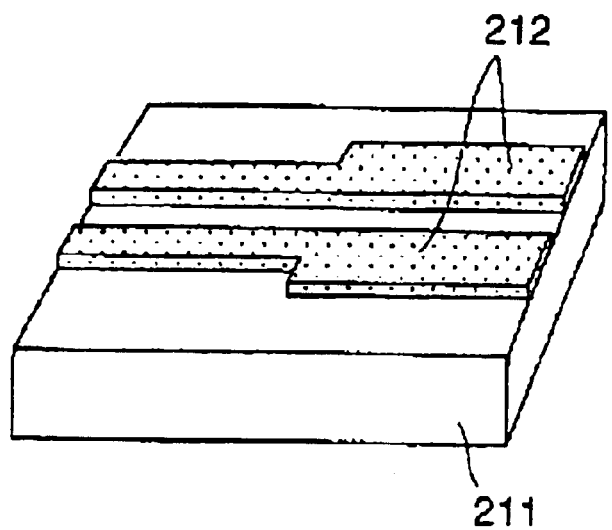
FIG. 28A is a view of a manufacturing process of a semiconductor device of a twelfth embodiment according to the present invention.

Referring to FIG. 28A, the $SiO_2$ film pattern 212 is formed on the InP substrate 211 as a width of the $SiO_2$ pattern 212 varies along an opening part which exposes the substrate 211. In a process shown in FIG. 28B following the process shown in FIG. 28A, dry etching is implemented to the InP substrate 211 in a state where the $SiO_2$ pattern 212 is a mask. Thereby a groove 211A having a depth of approximately 1 mm is formed on a surface of the InP substrate 211.

Figure 28B:
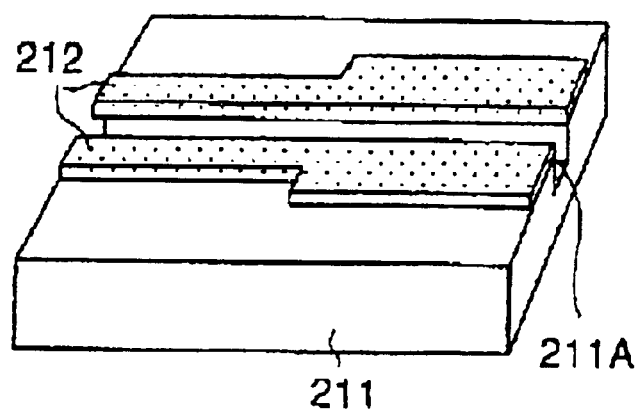
FIG. 28B is a view of a manufacturing process of a semiconductor device of a twelfth embodiment according to the present invention.
Figure 28C:
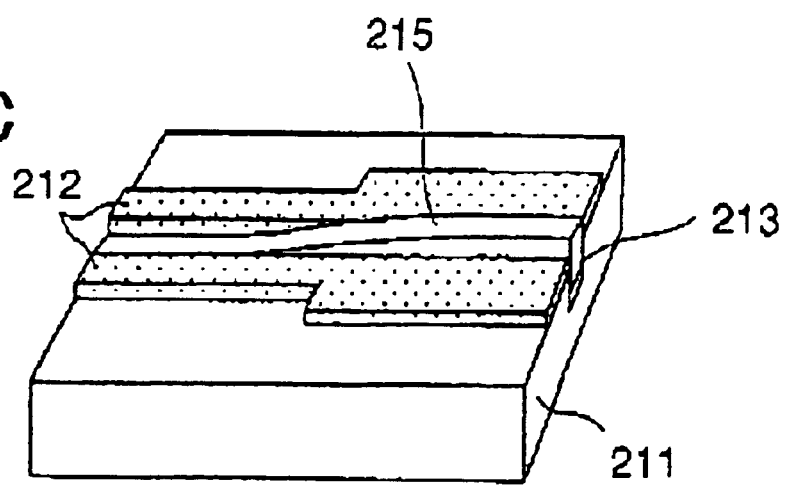
FIG. 28C is a view of a manufacturing process of a semiconductor device of a twelfth embodiment according to the present invention.

In a process shown in FIG. 28C following the process shown in FIG. 28B, the InGaAsP/InGaAsP multi-quantum well active layer 213 and the p-type InP clad layer 215 are formed by the MOVPE method as the groove 211A is buried. At that time, a thickness of the p-type InP clad layer 215 is set as a lowest surface part of an upper surface of the InP clad layer 215 is higher than a surface of the n-type InP substrate 211. Because a width of the $SiO_2$ pattern 212 varies along the <011>-direction, a variation of a film thickness is generated in the <011>-direction on the InP clad layer 215.

Figure 28D:
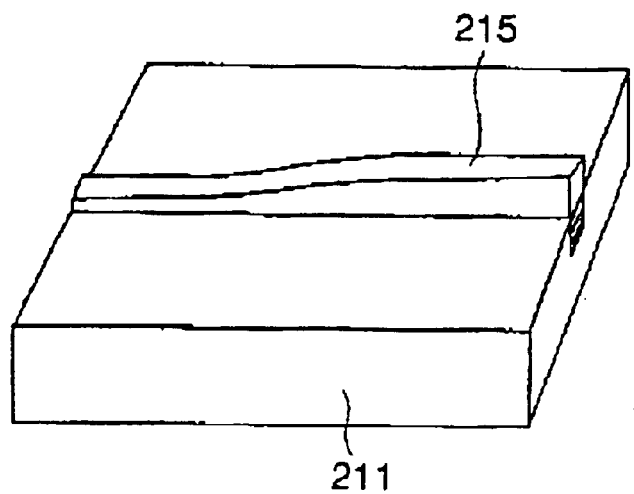
FIG. 28D is a view of a manufacturing process of a semiconductor device of a twelfth embodiment according to the present invention.
Figure 28E:
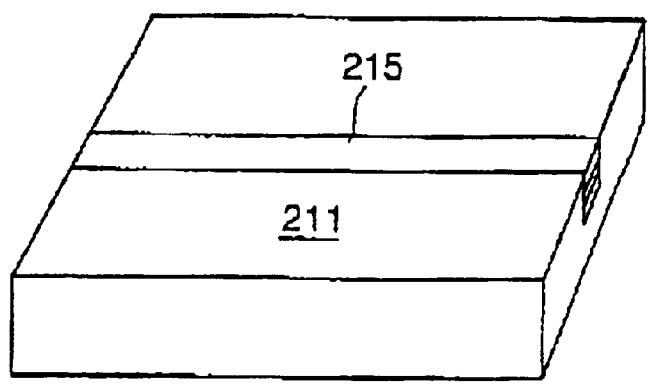
FIG. 28E is a view of a manufacturing process of a semiconductor device of a twelfth embodiment according to the present invention.

In a process shown in FIG. 28D following the process shown in FIG. 28C, the $SiO_2$ pattern 212 is eliminated by etching with the mixed liquid including hydrofluoric acid and a hydrogen peroxide water. In a process shown in FIG. 28E following the process shown in FIG. 28D, wet etching is implemented by the etchant of a mixed liquid including hydrochloric acid, acetic acid, and water.

As a result of the wet etching, the InP clad layer 215 is flattened, and thereby a flat surface corresponding to the InP substrate 211 as an upper surface of the clad layer 215 is achieved.

A description regarding a thirteenth embodiment of a manufacturing process of a multi layer optical wave guide will now be given, with reference of FIGS. 29A to 29G. In FIGS. 29A to 29E, parts that are the same as the parts described above are given the same reference numerals in, and explanation thereof will be omitted.

Figure 29A:
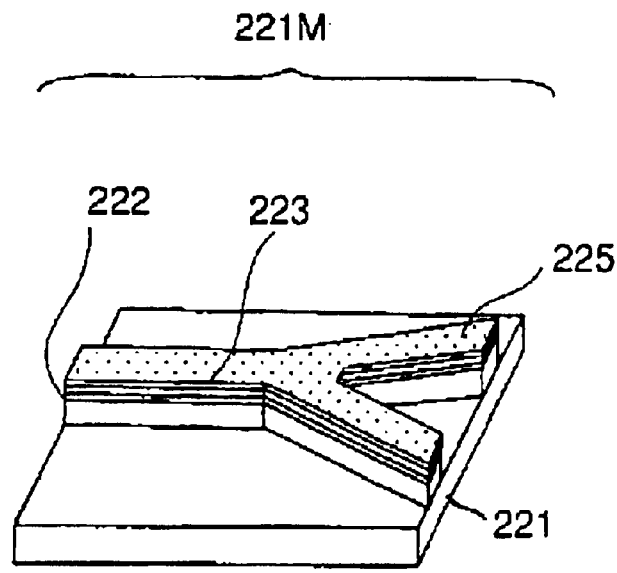
FIG. 29A is a view of a manufacturing process of a multiple optical wave guide of a thirteenth embodiment according to the present invention.

Referring to FIG. 29A, the InGaAsP/InGaAsP multi-quantum well active layer 222 is grown on the n-type InP substrate 221 and the InP clad layer 223 is grown on the InGaAsP/InGaAsP multi-quantum well active layer 222. After that, a first wave guide mesa stripe pattern 212M is formed by dry etching in a state where the $SiO_2$ pattern 225 is a mask. In an example shown in FIG. 29A, the first wave guide mesa stripe pattern 212M has a branch Y shape.

Figure 29B:
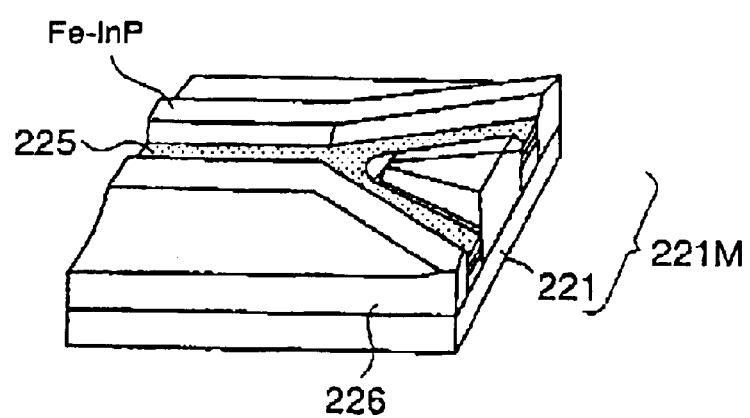
FIG. 29B is a view of a manufacturing process of a multiple optical wave guide of a thirteenth embodiment according to the present invention.

In a process shown in FIG. 29B following the process shown in FIG. 29A, the Fe doped InP buried layer 226 grows by the MOVPE method in a state where the $SiO_2$ pattern 225 is a selective growth mask, as the first wave guide mesa stripe pattern 212M is buried. In the process shown in FIG. 29B, a thickness of the Fe doped InP layer 226 is set as a lowest part of the Fe doped InP layer 226 is higher than an upper part of the first wave guide mesa stripe pattern 212M.

Figure 29C:
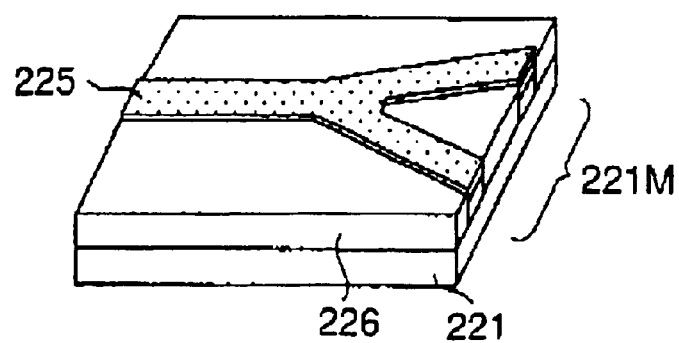
FIG. 29C is a view of a manufacturing process of a multiple optical wave guide of a thirteenth embodiment according to the present invention.

In a process shown in FIG. 29C following the process shown in FIG. 29B, wet etching is implemented by the etchant of a mixed liquid including hydrochloric acid, acetic acid, and water, and thereby a surface of the InP layer 226 is flattened.

Figure 29D:
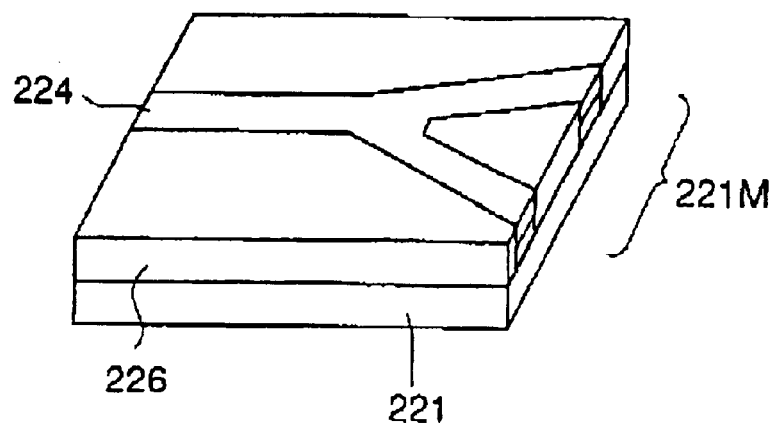
FIG. 29D is a view of a manufacturing process of a multiple optical wave guide of a thirteenth embodiment according to the present invention.
Figure 29E:
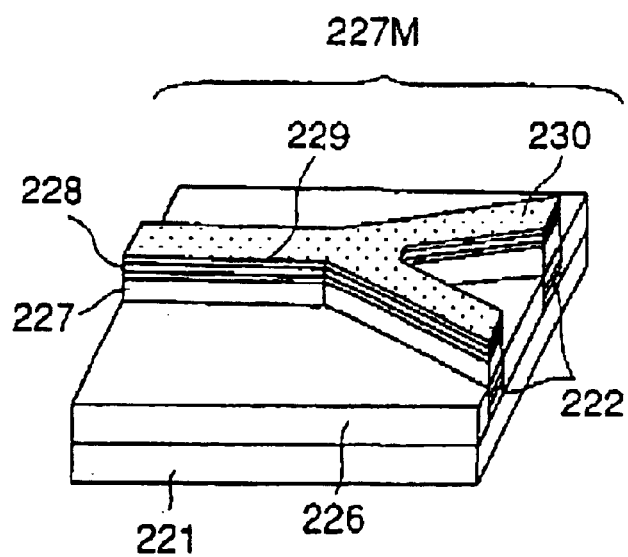
FIG. 29E is a view of a manufacturing process of a multiple optical wave guide of a thirteenth embodiment according to the present invention.

In a process shown in FIG. 29D following the process shown in FIG. 29C, the $SiO_2$ pattern 225 is removed by etching with the mixed liquid including hydrofluoric acid and a hydrogen peroxide water. In a process shown in FIG. 29E following the process shown in FIG. 29D, the InP clad layer 227 is grown on the InP layer 226, the InGaAsP/InGaAsP multi-quantum well active layer 228 is grown on the InP clad layer 227, and the InP clad layer 229 is grown on the InGaAsP/InGaAsP multi-quantum well active layer 228. After that, dry etching is implemented in a state where the $SiO_2$ pattern 230 formed on the InP clad layer 229 is a mask, and thereby a second wave guide mesa stripe pattern 227M is formed on the InP layer 226.

Figure 29F:
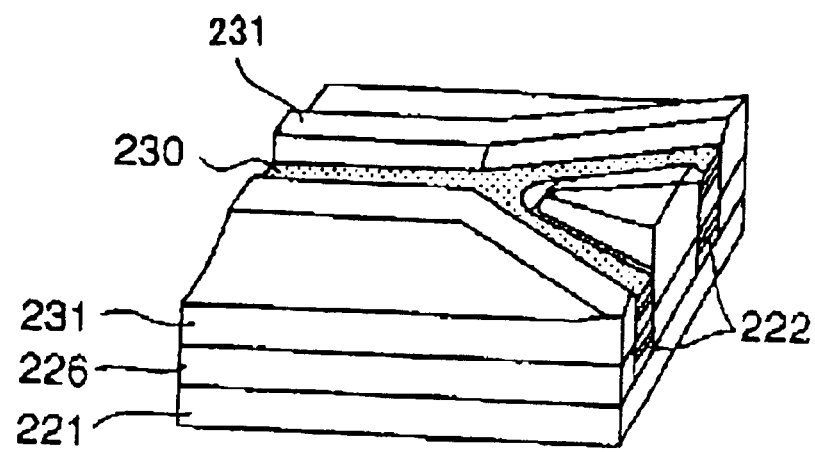
FIG. 29F is a view of a manufacturing process of a multiple optical wave guide of a thirteenth embodiment according to the present invention.

In a process shown in FIG. 29F, the Fe doped InP buried layer 231 is formed by the MOVPE method in a state where the $SiO_2$ pattern 230 is used as a selective growth mask. At that time, the Fe doped InP buried layer 231 has a thickness in a state where the lowest part of the Fe doped InP buried layer 231 is higher than the upper part of the second wave guide mesa stripe pattern 227M.

Figure 29G:
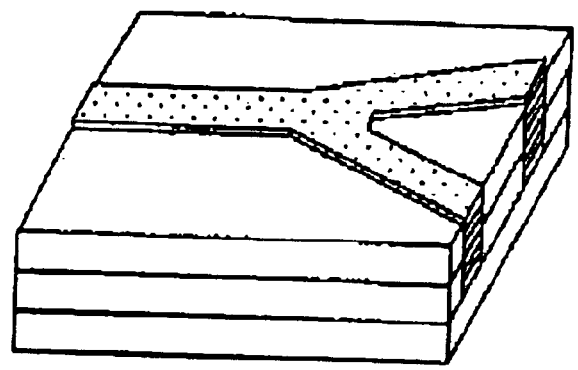
FIG. 29G is a view of a manufacturing process of a multiple optical wave guide of a thirteenth embodiment according to the present invention.

In a process shown in FIG. 29G following the process shown in FIG. 29F, wet etching is implemented by the etchant of a mixed liquid including hydrochloric acid, acetic acid, and water, and thereby the Fe-doped In layer 231 is flattened. After that, the $SiO_2$ pattern 230 is removed by etching with the mixed liquid including hydrofluoric acid and a hydrogen peroxide water, and thereby an optical wave guide having a double layer structure is achieved.

When the optical wave guide is multiple-grown, it is necessary that a surface is flat after respective layers are formed. However, in this embodiment, a thickness of the InP layer 226 or 231 is controlled, and flattening is implemented as corresponding to a lowest surface part of these layers. Such control of the layer thickness is not possible by polishing.

According to the above-described embodiments, the mixed liquid including hydrochloric acid, acetic acid, and water is used as the etchant. For flattening by the etchant in the present invention, a composition ratio of the etchant of hydrochloric acid, acetic acid, and water is set as 1:X:Y, where a concentration parameter X is in a range of 0 to 20 and a concentration parameter Y is in any range, is effective. Besides, if a mixed liquid of hydrochloric acid, acetic acid, hydrofluoric acid, and water is used as the etchant, a composition ratio of the etchant of hydrochloric acid, acetic acid, hydrogen peroxide water, and water is set as 1:X:Y:Z, where a concentration parameter X is in a range of 0 to 20, a concentration parameter Y is in a range of 0 to 0.3, with no range requirement for a concentration parameter Z, is effective to achieve an equivalent effect.

The present invention is not limited to these embodiments, but various variations and modifications may be made without departing from the scope of the present invention. Particularly, because the present invention is based on the flattening by anisotropy etching against a concave structure of the grown InP layer as a principle, the present invention can be applied to not only an optical semiconductor device but also any semiconductor device whose material is InP.

This patent application is based on Japanese priority patent application No. 2000-393318 filed on Dec. 25, 2000, the entire contents of which are hereby incorporated by reference.

What is claimed is:

1. A method of manufacturing a semiconductor device, comprising the steps of:
   (a) growing an InP layer on a surface of starting growth, resulting in the InP layer having a convex structure; and
   (b) wet etching the InP layer by an anisotronic etchant including hydrochloric acid and acetic acid, and thereby flattening a surface of the InP layer.

2. The method of manufacturing a semiconductor device as claimed in claim 1, wherein the surface of starting growth is a flat surface and has a selective growth mask partially covering said surface, and the convex structure is made as the convex structure corresponds to the selective growth mask, in the step of (a).

3. The method of manufacturing a semiconductor device as claimed in claim 1, wherein the InP layer has a flat surface comprised of at least one of a (100) surface, a (011) surface, or a (0-1-1) surface, after the step of (b) is completed.

4. The method of manufacturing a semiconductor device as claimed in claim 1, wherein the InP layer has a flat surface closer to at least one of a (100) surface, a (011) surface, or a (0-1-1) surface, after the step of (b) is completed.

5. The method of manufacturing a semiconductor device as claimed in claim 1, wherein a lower surface of the InP layer than a highest position of the surface of starting growth is made in the step of (a), and the InP layer has a flat surface locating at a height position corresponding to a lowest position of the InP layer from a surface of a substrate, after the step of (b) is completed.

6. The method of manufacturing a semiconductor device as claimed in claim 1, wherein a same position or higher surface of the InP layer than a highest position of the surface of starting growth is made in the step of (a), and the InP layer has a flat surface locating at a height position corresponding to a highest position of the surface of starting growth from a surface of a substrate, after the step of (b) is completed.

7. The method of manufacturing a semiconductor device as claimed in claim 1, wherein the etchant includes hydrochloric acid and acetic acid, and a concentration of acetic acid is a maximum of 20 times a concentration of hydrochloric acids.

8. The method of manufacturing a semiconductor device as claimed in claim 1, wherein the convex structure results from a convex structure of the surface, in the step of (a).

9. The method of manufacturing a semiconductor device as claimed in claim 8, wherein the convex structure of the surface of starting growth is a mesa structure.

10. The method of manufacturing a semiconductor device as claimed in claim 8, wherein the convex structure of the surface of starting growth is a step structure.

11. The method of manufacturing a semiconductor device as claimed in claim 8, wherein a selective growth mask is provided at part of the convex structure, and the convex structure of the InP layer is formed as corresponding to an edge of the selective growth mask, in the step of (a).

12. The method of manufacturing a semiconductor device as claimed in claim 8, wherein a slope area is formed along a side surface of the convex structure on the surface of starting growth by the convex structure of the InP layer, in the step of (a).

13. The method of manufacturing a semiconductor device as claimed in claim 8, wherein the InP layer is formed on the surface of starting growth and the convex step structure is covered with the InP layer on the surface of starting growth by the convex structure of the InP layer, in the step of (a).

14. The method of manufacturing a semiconductor device as claimed in claim 1, wherein the etchant further includes an application material comprised of water or hydrogen peroxide water.

15. The method of manufacturing a semiconductor device as claimed in claim 14, wherein the hydrogen peroxide water having a concentration of a maximum of 30% by volume of hydrochloric acid is added into the etchant by the application material.

16. The method of manufacturing a semiconductor device as claimed in claim 14, wherein the application material is comprised of water.

17. The method of manufacturing a semiconductor device as claimed in claim 14, wherein the application material is comprised of water and hydrogen peroxide water.

18. A method of manufacturing a semiconductor device, comprising the steps of:
(a) etching an InP layer which shoulders a selective etching mask, has a lower surface area than the selective etching mask, and has a convex structure on a surface of the InP layer, by an anisotropic etchant including hydrochloric acid and acetic acid; and
(b) flattening a surface of the InP layer except an area under the selective etching mask.

19. The method of manufacturing a semiconductor device as claimed in claim 18, wherein the selective etching mask is provided on a surface of the convex structure part on the InP layer.

20. The method of manufacturing a semiconductor device as claimed in claim 18, wherein the etchant includes hydrochloric acid and acetic acid, and a concentration of acetic acid is a maximum of 20 times a concentration of hydrochloric acid.

21. The method of manufacturing a semiconductor device as claimed in claim 18, wherein a convex structure of the InP layer results from a convex structure part of a surface of starting growth.

22. The method of manufacturing a semiconductor device as claimed in claim 21, wherein the selective etching mask is provided on an upper part of the convex structure part on the surface of starting growth.

23. The method of manufacturing a semiconductor device as claimed in claim 18, wherein the selective etching mask is selected from the group consisting of a compound semiconductor other than InP and an insulating material.

24. The method of manufacturing a semiconductor device as claimed in claim 23, wherein the selective etching mask is made of silicon oxide, silicon nitride, InGaAs, InGaAsP, AlGaInP, AlGaAs, or GaInNAs.

25. The method of manufacturing a semiconductor device as claimed in claim 18, wherein the etchant further includes an application material comprising water or hydrogen peroxide water.

26. The method of manufacturing a semiconductor device as claimed in claim 25, wherein the hydrogen peroxide water having a concentration of a maximum of 30% by volume of hydrochloric acid is added into the etchant by the application material.

27. The method of manufacturing a semiconductor device as claimed in claim 25, wherein the application material is made of water.

28. A method of manufacturing a semiconductor device, comprising the steps of:
(a) forming a semiconductor structure in which first to fourth semiconductor layers are grown, wherein the first semiconductor layer made of n-type InP is grown on a n-type InP substrate, the second semiconductor layer having a smaller band gap than InP is grown on the first semiconductor layer, the third semiconductor layer made of p-type InP is grown on the second semiconductor layer, and the fourth semiconductor layer made of InGaAs or InGaAsP is grown on the third semiconductor layer;
(b) etching the semiconductor structure in which the first to the fourth semiconductor layers are grown, and thereby a mesa stripe is formed on part including at least the second to fourth semiconductor layers;
(c) growing a fifth semiconductor layer on the InP substrate on which the mesa stripe is formed, as a lowest surface height of the fifth semiconductor layer from a surface of the substrate is higher than the fourth semiconductor layer; and (d) anisotropic etching a surface of the fifth semiconductor layer by an etchant including hydrochloric acid and acetic acid.

29. A method of manufacturing a semiconductor device, comprising the steps of:
(a) forming a semiconductor structure in which first to fourth semiconductor layers are grown, wherein the first semiconductor layer made of n-type InP is grown on a n-type InP substrate, the second semiconductor layer having a smaller band gap energy than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure in which the first to the fourth semiconductor layers are grown, and thereby a mesa stripe is formed on part including at least the second to fourth semiconductor layers;
(c) growing a fifth semiconductor layer on the InP substrate on which the mesa stripe is formed, as a lowest surface height of the fifth semiconductor layer from a surface of the substrate is higher than the fourth semiconductor layer and as the mesa stripe is covered with the fifth semiconductor layer; and
(d) anisotropic etching a surface of the fifth semiconductor layer by an etchant including hydrochloric acid and acetic acid.

30. A method of manufacturing a semiconductor device, comprising the steps of:
(a) forming a semiconductor structure in which first to third semiconductor layers are grown, wherein the first semiconductor layer made of n-type InP is grown on a n-type InP substrate, the second semiconductor layer having a smaller band gap than InP is grown on the first semiconductor layer, and the third semiconductor layer made of p-type InP is grown on the second semiconductor layer;
(b) etching the semiconductor structure by using a protection pattern formed on the semiconductor structure as a mask, and thereby a mesa stripe including at least the second and third semiconductor layers is formed;
(c) growing a fourth semiconductor layer made of p-type InP on the InP substrate on which the mesa stripe is formed, as a lowest surface height of the fourth semiconductor layer from a surface of the substrate is higher than an upper surface of the second semiconductor layer and lower than the third semiconductor layer;
(d) anisotroric etching a surface of the fourth semiconductor layer by an etchant including hydrochloric acid and acetic acid;
(e) growing a fifth semiconductor layer made of n-type InP on the fourth semiconductor layer;
(f) removing the protection pattern used as a mask in the step of (b) by etching; and
(g) growing a sixth semiconductor layer made of p-type InP on the third and fifth semiconductor layers, and growing a seventh semiconductor layer of InGaAs or InGaAsP on the sixth semiconductor layer.

31. A method of manufacturing a semiconductor device, comprising the steps of:
(a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure by using a protection pattern formed on the semiconductor structure as a mask, and thereby a mesa stripe including at least the second to fourth semiconductor layers is formed;
(c) removing the protection pattern by etching;
(d) growing a fifth semiconductor layer made of p-type InP on the substrate where the mesa stripe is formed, as a lowest surface height of the fifth semiconductor layer from a surface of the substrate is higher than the second semiconductor layer and is lower than the fourth semiconductor layer and as the mesa stripe is included;
(e) anisotropic etching a surface of the fifth semiconductor layer by an etchant including hydrochloric acid and acetic acid;
(f) growing a sixth semiconductor layer made of n-type InP on the fifth semiconductor layer, as a lowest surface height of the sixth semiconductor layer from a surface of the substrate is lower than the fourth semiconductor layer;
(g) anisotropic etching a surface of the sixth semiconductor layer by an etchant including hydrochloric acid and acetic acid;
(h) growing a seventh semiconductor layer made of p-type InP, as a lowest surface height of the seventh semiconductor layer from a surface of the substrate is higher than the fourth semiconductor layer; and
(i) anisotropic etching a surface of the seventh semiconductor layer by an etchant including hydrochloric acid and acetic acid.

32. A method of manufacturing a semiconductor device, comprising the steps of:
(a) forming a semiconductor structure in which first to fourth semiconductor layers are grown, wherein the first semiconductor layer made of n-type InP is grown on an n-type InP substrate, the second semiconductor layer having a smaller band gap energy than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure by using a protection pattern formed on the semiconductor structure as a mask, and thereby a mesa stripe including at least the second to fourth semiconductor layers is formed;
(c) removing the protection pattern by etching;
(d) growing a fifth semiconductor layer made of p-type InP on the substrate where the mesa stripe is formed, as a lowest surface height of the fifth semiconductor layer from a surface of the substrate is higher than the second semiconductor layer and lower than the fourth semiconductor layer and as the mesa stripe is included;
(e) anisotropic etching a surface of the fifth semiconductor layer by an etchant including hydrochloric acid and acetic acid;
(f) growing a sixth semiconductor layer made of n-type InP on the fifth semiconductor layer, and growing a seventh semiconductor layer made of p-type InP on the sixth semiconductor layer;

(g) anisotropic etching a surface of the seventh semiconductor layer by an etchant including hydrochloric acid and acetic acid;
(h) removing the fourth semiconductor layer by etching; and
(i) growing an eighth semiconductor layer made of p-type InP, and growing a ninth semiconductor layer made of InGaAs or InGaAsP on the eighth semiconductor layer.

33. A method of manufacturing a semiconductor device, comprising the steps of:
(a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure, and thereby a mesa stripe including at least the second to fourth semiconductor layers is formed;
(c) growing a fifth semiconductor layer on the substrate where the mesa stripe is formed, as a contact part height between the fifth semiconductor layer and the mesa stripe from a surface of the substrate is higher than the second semiconductor layer and lower than the fourth semiconductor layer and as the mesa stripe is included;
(d) growing a sixth semiconductor layer made of p-type InP on the fifth semiconductor layer; and
(e) anisotropic etching a surface of the sixth semiconductor layer by an etchant including hydrochloric acid and acetic acid.

34. A method of manufacturing a semiconductor device, comprising the steps of:
(a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure by using a protection pattern formed on the semiconductor structure as a mask, and thereby a mesa stripe including the third and fourth semiconductor layers is formed;
(c) removing the protection pattern by etching;
(d) growing a fifth semiconductor layer made of n-type InP on the substrate where the mesa stripe is formed, as a lowest surface height of the fifth semiconductor layer from a surface of the substrate is lower than the fourth semiconductor layer;
(e) anisotropic etching a surface of the fifth semiconductor layer by an etchant including hydrochloric acid and acetic acid;
(f) growing a sixth semiconductor layer made of p-type InP on the fifth semiconductor layer, as a lowest surface height of the sixth semiconductor layer from a surface of the substrate is higher than the fourth semiconductor layer; and
(g) anisotropic etching a surface of the sixth semiconductor layer by an etchant including hydrochloric acid and acetic acid.

35. A method of manufacturing a semiconductor device, comprising the steps of:
(a) forming a semiconductor structure in which first to fourth semiconductor layers are grown, wherein the first semiconductor layer made of n-type InP is grown on an n-type InP substrate, the second semiconductor layer having a smaller band gap than InP is grown on the first semiconductor layer, the third semiconductor layer made of p-type InP is grown on the second semiconductor layer, and the fourth semiconductor layer of InGaAs or InGaAsP is grown on the third semiconductor layer;
(b) etching the semiconductor structure, and thereby a mesa stripe including the third and fourth semiconductor layers is formed;
(c) growing a fifth semiconductor layer made of n-type InP on the substrate where the mesa stripe is formed, as a highest part height of the fifth semiconductor layer from a surface of the substrate is lower than the fourth semiconductor layer;
(d) anisotropic etching a surface of the fifth semiconductor layer by an etchant including hydrochloric acid and acetic acid;
(e) growing a sixth semiconductor layer made of p-type InP on the fifth semiconductor layer, as a lowest part height of the sixth semiconductor layer from a surface of the substrate is higher than the fourth semiconductor layer; and
(f) anisotropic etching a surface of the sixth semiconductor layer by an etchant including hydrochloric acid and acetic acid.

36. A method of manufacturing an optical wave guide, comprising the steps of:
(a) forming a semiconductor structure, wherein the first semiconductor layer made of InP is grown on an InP substrate, the second semiconductor layer having a larger refractive index than a refractive index of the first semiconductor layer is grown on the first semiconductor layer, and the third semiconductor layer made of hip is grown on the second semiconductor layer;
(b) etching the semiconductor structure by using a protection pattern formed on the semiconductor structure as a mask, and thereby a mesa pattern including at least the second and third semiconductor layers is formed;
(c) growing a fourth semiconductor layer made of InP on the substrate where the mesa stripe is formed in a state where the protection pattern is shouldered by the mesa pattern;
(d) anisotropic etching a surface of the fourth semiconductor layer in a state where the protection pattern is shouldered by the mesa pattern, by an etchant including hydrochloric acid and acetic acid;
(e) removing the protection pattern; and
(f) growing a fifth semiconductor layer made of InP.

37. A method of manufacturing an optical wave guide, comprising the steps of:
(a) forming a semiconductor structure, wherein a first semiconductor layer made of InP is grown on an InP substrate, a second semiconductor layer having a larger refractive index than a refractive index of the first semiconductor layer is grown on the first semiconductor layer, a third semiconductor layer made of InP is grown on the second semiconductor layer, and a fourth semiconductor layer made of InGaAs or InGaAsP is grown on the third semiconductor layer;

(b) forming a mesa pattern including at least the second to fourth semiconductor layers by etching the semiconductor structure;

(c) growing a fifth semiconductor layer made of InP on the substrate where the mesa pattern is formed, as the mesa pattern is covered; and (d) anisotropic etching a surface of the fifth semiconductor layer by an etchant including hydrochloric acid and acetic acid.

38. A method of manufacturing a semiconductor device, comprising the steps of:

(a) forming a selective growth mask on an InP substrate;

(b) forming a semiconductor pattern by selectively growing a first semiconductor layer made of InP on an InP substrate where the selective growth mask is formed, selectively growing a second semiconductor layer having a smaller band gap than InP on the first semiconductor layer, and selectively growing a third semiconductor layer made of InP on the second semiconductor layer; and (c) anisotropic etching a surface of the third semiconductor layer by etchant including hydrochloric acid and acetic acid.

39. A method of manufacturing a semiconductor device, comprising the steps of:

(a) forming a selective growth mask on an InP substrate;

(b) forming a groove by etching uncovered area by the selective etching mask on a surface of the InP substrate;

(c) forming a semiconductor structure by growing a first semiconductor layer made of InP on the substrate, growing a second semiconductor layer having a smaller band gap than InP on the first semiconductor layer, and growing a third semiconductor layer made of InP on the second semiconductor layer, in a state where the selective growth mask is formed on the substrate;

(d) removing the selective growth mask; and (e) anisotropic etching a surface of the third semiconductor layer by etchant including hydrochloric acid and acetic acid.

40. A method of manufacturing a multiple layer optical wave guide, comprising the steps of:

(a) forming a first growing semiconductor structure by growing a first semiconductor layer made of InP on an InP substrate, growing a second semiconductor layer having a smaller band gap than InP on the first semiconductor layer, and growing a third semiconductor layer made of InP on the second semiconductor layer;

(b) forming a first mesa stripe including at least the second and third semiconductor layers by forming a first protection pattern on the first growing semiconductor structure and etching the first growing semiconductor structure with the first protection pattern as a mask;

(c) growing a fourth semiconductor layer made of InP having a high resistance on the substrate where the first mesa stripe is formed, in a state where the first protection pattern remains on the first mesa stripe;

(d) anisotropic etching a surface of the fourth semiconductor layer by etchant including hydrochloric acid and acetic acid;

(e) removing the first protection pattern;

(f) forming a second semiconductor structure by growing a fifth semiconductor layer made of InP on the fourth semiconductor layer, growing a sixth semiconductor layer having a smaller band gap than InP on the fifth semiconductor layer, and growing a seventh semiconductor layer made of InP on the sixth semiconductor layer;

(g) forming a second mesa stripe including at least the sixth and seventh semiconductor layers by forming a second protection pattern on the second semiconductor structure and etching the second semiconductor structure with the second protection pattern as a mask;

(h) growing an eighth semiconductor layer made of InP on the first semiconductor structure where the second mesa stripe is formed, in a state where the second protection pattern remains on the second mesa stripe;

(i) anisotropic etching a surface of the eighth semiconductor layer by etchant including hydrochloric acid and acetic acid; and (j) removing the second protection pattern by etching.

* * * * *